(12) United States Patent
Ehsan et al.

(10) Patent No.: US 11,473,193 B2
(45) Date of Patent: Oct. 18, 2022

(54) FABRICATION, CHARACTERIZATION AND PHOTOELECTROCHEMICAL PROPERTIES OF CEO$_2$-TIO$_2$ THIN FILM ELECTRODES

(71) Applicant: King Fahd University of Petroleum and Minerals, Dhahran (SA)

(72) Inventors: Muhammad Ali Ehsan, Dhahran (SA); Abdul Rehman, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 675 days.

(21) Appl. No.: 16/399,316

(22) Filed: Apr. 30, 2019

(65) Prior Publication Data
US 2020/0347496 A1    Nov. 5, 2020

(51) Int. Cl.
| | |
|---|---|
| C23C 16/40 | (2006.01) |
| C23C 16/448 | (2006.01) |
| C25B 1/04 | (2021.01) |
| B01J 19/12 | (2006.01) |
| H01G 9/20 | (2006.01) |
| H01G 9/00 | (2006.01) |
| C25B 1/55 | (2021.01) |
| C25B 11/081 | (2021.01) |
| C25B 11/091 | (2021.01) |

(52) U.S. Cl.
CPC ........... *C23C 16/405* (2013.01); *B01J 19/122* (2013.01); *C23C 16/40* (2013.01); *C23C 16/4486* (2013.01); *C25B 1/04* (2013.01); *C25B 1/55* (2021.01); *C25B 11/081* (2021.01); *C25B 11/091* (2021.01); *H01G 9/0029* (2013.01); *H01G 9/2022* (2013.01); *H01G 9/2036* (2013.01); *B01J 2219/1203* (2013.01)

(58) Field of Classification Search
None
See application file for complete search history.

(56) References Cited

U.S. PATENT DOCUMENTS

| | | | |
|---|---|---|---|
| 9,005,816 B2 | 4/2015 | Amine et al. | |
| 2004/0058167 A1* | 3/2004 | Arbab | C23C 16/405 428/426 |
| 2007/0092734 A1* | 4/2007 | Durandeau | C23C 16/405 428/432 |
| 2012/0156578 A1* | 6/2012 | Taniguchi | C25B 1/55 204/242 |
| 2014/0044977 A1 | 2/2014 | Manning et al. | |
| 2016/0096770 A1 | 4/2016 | Miki Yoshida et al. | |
| 2018/0087164 A1* | 3/2018 | Finke | C25B 1/04 |
| 2018/0347039 A1* | 12/2018 | Arnepalli | C23C 16/34 |
| 2018/0350604 A1 | 12/2018 | Visser et al. | |

FOREIGN PATENT DOCUMENTS

CN    108751741 A    11/2018

OTHER PUBLICATIONS

Edusi et al. "The Effect of Solvent on the Phase of Titanium Dioxide Deposited by Aerosol-assisted CVD". Chem. Vap. Deposition, 2012, 18, 126-132 http://dx.doi.org/10.1002/cvde.201106961 (Year: 2012).*
Ehsan et al. "Fabrication of CoTiO3—TiO2 composite films from a heterobimetallic single source precursor for electrochemical sensing of dopamine". Dalton Trans., 2016, 45, 10222 (Year: 2016).*
Ehsan et al. Aerosol assisted chemical vapor deposition of magnesium orthotitanate (Mg2TiO4) films from a trinuclear molecular precursor. Polyhedron, 2017, 133, 179-186. http://dx.doi.org/10.1016/j.poly.2017.05.035. (Year: 2017).*
Ehsan et al. "Facile fabrication of CeO2—TiO2 thin films via solution based CVD and their photoelectrochemical studies". Journal of Materials Science: Materials in Electronics (Jun. 23, 2018) 29:13209-13219. https://doi.org/10.1007/sl0854-018-9445-x (Year: 2018).*
Edusi, et al.; Aerosol-Assisted CVD of Titanium Dioxide Thin Films from Methanolic Solutions of Titanium Tetraisopropoxide; Substrate and Aerosol-Selective Deposition of Rutile or Anatase; Chemical Vapor Deposition vol. 17, Issue 1-3; Feb. 25, 2011; Abstract Only; 1 Page.
Warwick, et al.; Hybrid chemical vapour and nanoceramic aerosol assisted deposition for multifunctional nanocomposite thin films; Thin Solid Films, vol. 519, Issue 18; pp. 5942-5948; Mar. 31, 2011; Abstract Only; 1 Page.
Naeem, et al.; Single step aerosol assisted chemical vapor deposition of p-n Sn(II) oxide-Ti(IV) oxide nanocomposite thin film electrodes for investigation of photoelectrochemical properties†; New J. Chem. 42; Feb. 9, 2018; 12 Pages.
Teoh, et al.; Flame spray pyrolysis: An enabling technology for nanoparticles design and fabrication; Nanoscale 2; pp. 1324-1347; Mar. 4, 2010; 25 Pages.
Tan, et al.; Visible light active Ce/Ce2O/CeO2/TiO2 nanotube arrays for efficient hydrogen production by photoelectrochemical water splitting; International Journal of Hydrogen energy 41; pp. 5437-5444; Mar. 5, 2016; 8 Pages.
Zuas, et al.; Synthesis, Characterization and Properties of CeO2-doped TiO2 Composite Nanocrystals vol. 19, No. 4; Mar. 10, 2013; 5 Pages.
Jiang, et al.; Preparation and photocatalytic activity of CeO2/TiO2 interface composite film; Applied Surface Science 255; pp. 5975-5978; Feb. 13, 2009; 4 Pages.

(Continued)

*Primary Examiner* — Jose I Hernandez-Kenney
(74) *Attorney, Agent, or Firm* — Oblon, McClelland, Maier & Neustadt, L.L.P.

(57) ABSTRACT

A simple, one-step method for producing a homogenous CeO$_2$—TiO$_2$ composite thin film using aerosol-assisted chemical vapor deposition ("CVD") of a solution containing triacetatocerium (III) and tetra isopropoxytitanium (IV) on a fluorine-doped tin oxide ("FTO") substrate at a temperature ranging from about 500 to about 650° C. Methods for using the film produced by this method.

18 Claims, 6 Drawing Sheets

(56) References Cited

OTHER PUBLICATIONS

Li, et al. ; Thermally stable ordered mesoporous CeO2/TiO2 visible-light photocatalysts ; Physical Chemistry Chemical Physics ; Jan. 28, 2009 ; 10 Pages.

Zhang, et al. ; Preparation of hollow core/shell CeO2@TiO2 with enhanced photocatalytic performance ; J Mater Sci 50 ; pp. 5228-5237 ; May 12, 2015 ; 10 Pages.

Fan, et al. ; Enhanced photocatalyticactivityofhierarchical flower-likeCeO2/TiO2 heterostructures ; Materials Letters 175 ; pp. 36-39 ; Mar. 29, 2016 ; 4 Pages.

Chaisuk, et al. ; Preparation and characterization of CeO2/TiO2 nanoparticles by flame spray pyrolysis ; Ceramics International 37 ; pp. 1459-1463 ; Dec. 2, 2010 ; 5 Pages.

Shan, et al. ; An environmentally-benign CeO2—TiO2 catalyst for the selective catalytic reduction of NOx with NH3 in simulated diesel exhaust; Catalysis Today 184 ; pp. 160-165 ; Dec. 18, 2011 ; 6 Pages.

Ehsan, et al. ; Facile fabrication of CeO2—TiO2 thin films via solution based CVD and their photoelectrochemical studies ; Journal of Materials Science: Materials in Electronics 29 ; pp. 13209-13219 ; Jun. 23, 2018;13 Page.

\* cited by examiner

FIG. 2A
FIG. 2B
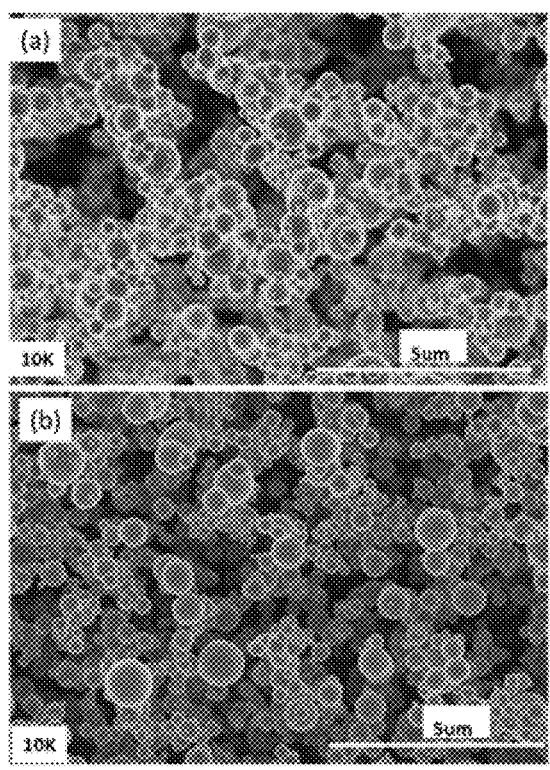
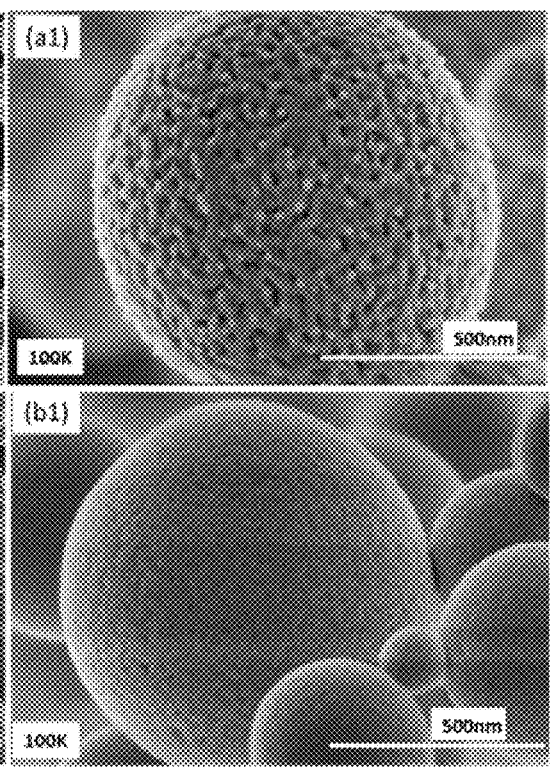
FIG. 2C
FIG. 2D
FIG. 3A  FIG. 3B  FIG. 3E  FIG. 3F
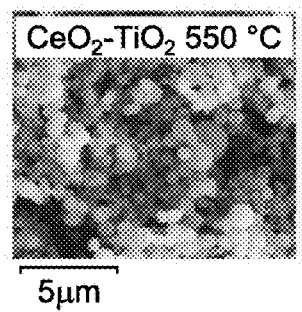 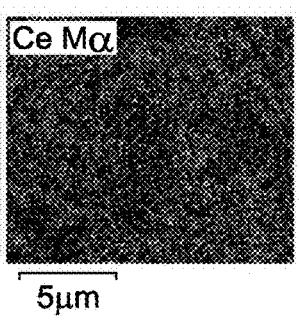 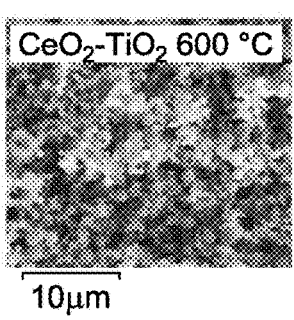 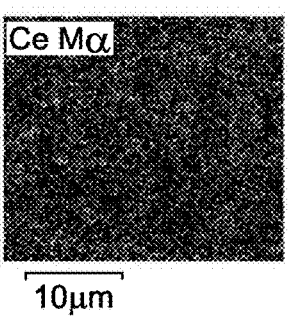
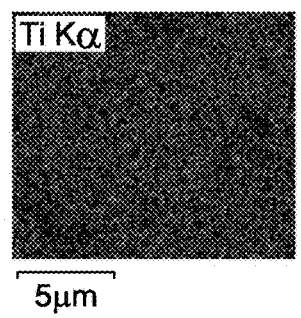 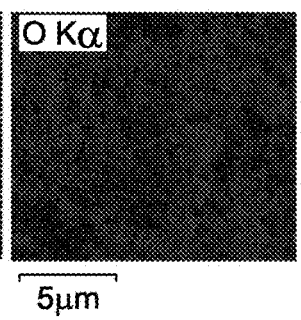
FIG. 3C  FIG. 3D  FIG. 3G  FIG. 3H

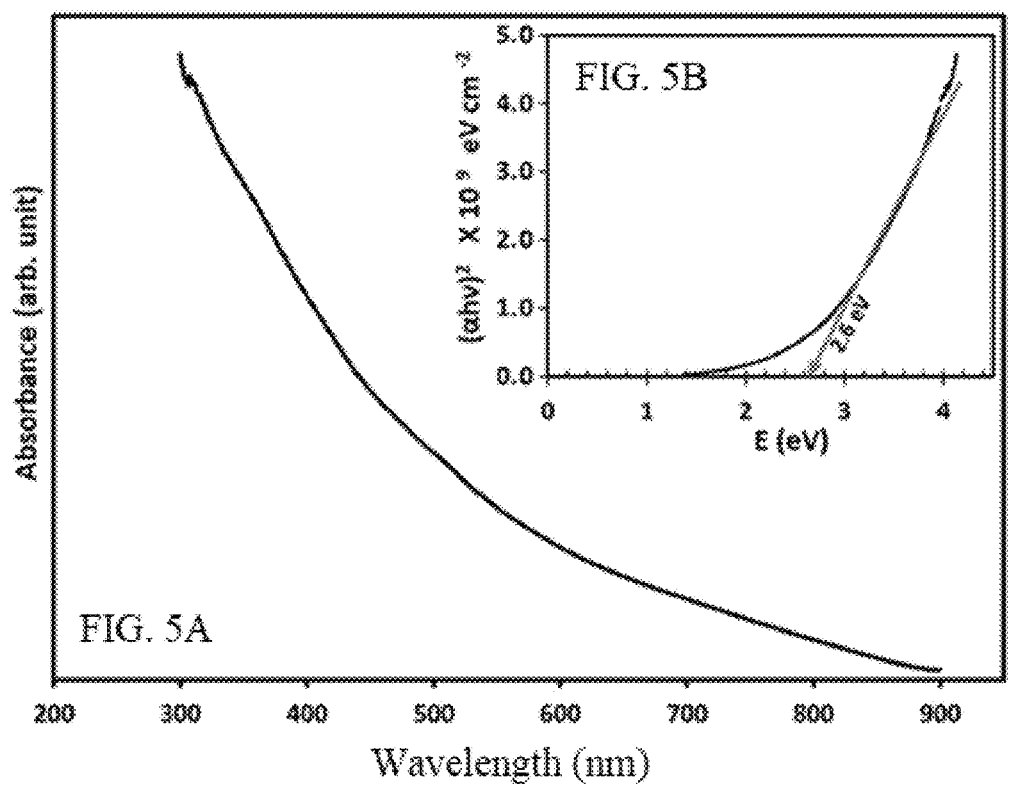
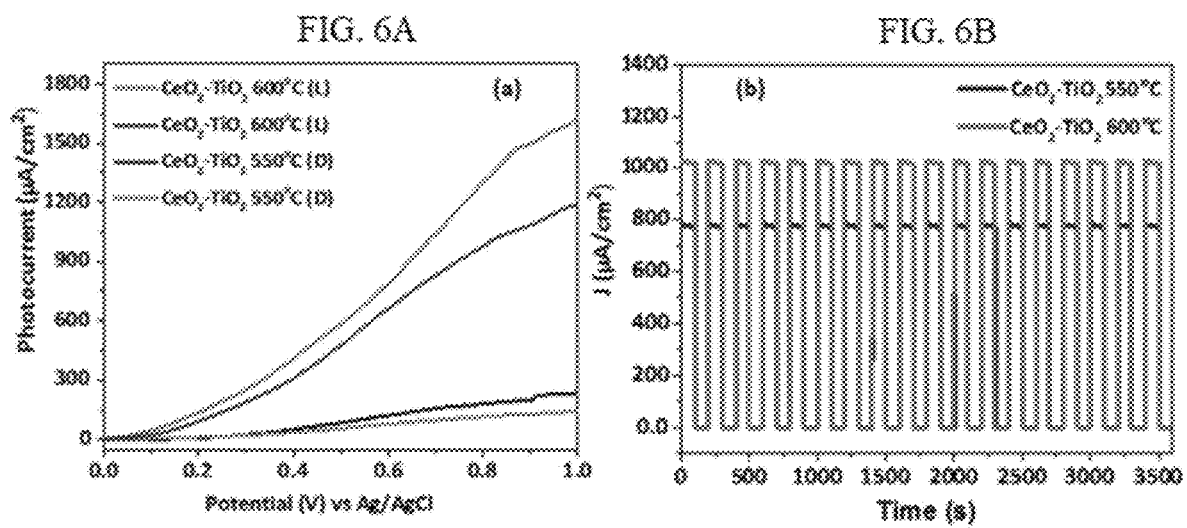

FABRICATION, CHARACTERIZATION AND PHOTOELECTROCHEMICAL PROPERTIES OF CEO$_2$-TIO$_2$ THIN FILM ELECTRODES

BACKGROUND OF THE INVENTION

Field of the Invention

The invention pertains to the field of photochemistry especially to novel methods for fabricating CeO$_2$—TiO$_2$ thin film electrodes.

Description of Related Art

The development of new synthetic routes for designing more robust, stable and functionally active forms of functional materials such as nanostructured photocatalysts is being pursued by many groups within the field; X. Chen, S. Shen, L. Guo, S. S. Mao, Chemical Reviews, 110, 6503-6570 (2010); S. S. Mao, S. Shen, Nature Photonics, 7, 944-946 (2013).

TiO$_2$ is considered a wide band gap material (e.g., 3.0-3.2 eV) and its use has been proposed for a diverse range of photocatalytic applications. However, its utility has been limited by its low capacity to exploit solar energy (e.g., 5%), and by the massive and fast recombination of charge carriers generated in it by the sunlight; H. Zhang, X. Liu, Y. Li, Q. Sun, Y. Wang, B. J. Wood, P. Liu, D. Yang, H. Zhao, Journal of Materials Chemistry, 22, 2465-2472 (2012); K.-N. P. Kumar, K. Keizer, A. Burggraaf, T. Okubo, H. Nagamoto, S. Morooka, Nature, 358, 48-51 (1992).

Separation of charge carriers, extension of the absorption spectrum and the increase of cumulative photon absorption, thus require modifications in TiO$_2$, the most promising of which is its coupling with other metal oxides; M. A. Mansoor, M. Mazhar, A. Pandikumar, H. Khaledi, H. N. Ming, Z. Arifin, International Journal of Hydrogen Energy, 41, 9267-9275 (2016); M. A. Mansoor, M. Mazhar, V. McKee, Z. Arifin, Polyhedron, 75, 135-140 (2014); Y. Gun, G. Y. Song, V. H. V. Quy, J. Heo, H. Lee, K.-S. Ahn, S. H. Kang, ACS applied materials & interfaces, 7, 20292-20303 (2015). Metal oxides include Fe$_2$O$_3$, J.-S. Yang, W.-H. Lin, C.-Y. Lin, B.-S. Wang, J.-J. Wu, ACS applied materials & interfaces, 7 13314-13321, (2015); BiVO$_4$, S. Ho-Kimura, S. J. Moniz, A. D. Handoko, J. Tang, Journal of Materials Chemistry A, 2, 3948-3953 (2014), J. Resasco, H. Zhang, N. Kornienko, N. Becknell, H. Lee, J. Guo, A. L. Briseno, P. Yang, ACS central science, 2, 80-88 (2016); and SnO$_2$, M. Radecka, A. Wnuk, A. Trenczek-Zajac, K. Schneider, K. Zakrzewska, International Journal of Hydrogen Energy, 40, 841-851 (2015). In all these combinations, TiO$_2$ is mixed with a metal oxide possessing a conduction band at a lower potential than TiO$_2$ itself. This allows the electrons present in the conduction band of TiO$_2$ to be transferred to the second semiconductor, thereby reducing the probability of electron-hole recombination at hetereojunctions.

Ceria-titania mixed oxide (CeO$_2$—TiO$_2$) is one material used for photoelectrochemical (PEC) splitting of water to generate green fuel (H$_2$) and is an important catalytic material which has been synthesized in various nanostructured types the sizes and shapes of which effect its optical and catalytic properties; J. Gong, F. Meng, X. Yang, Z. Fan, H. Li, Journal of Alloys and Compounds, 689 606-616 (2016); F. Meng, L. Wang, J. Cui, Journal of Alloys and Compounds, 556, 102-108 (2013); L. Wang, F. Meng, Materials Research Bulletin, 48 3492-3498 (2013); L. Wang, F. Meng, K. Li, F. Lu, Applied Surface Science, 286 269-274 (2013). CeO$_2$ has also been the subject of water splitting chemistry for H$_2$ production and other catalytic reactions under UV illumination, thanks to its band gap energy of ~2.8 eV and the presence of facile interchangeable redox chemistry (Ce$^{4+}$↔Ce$^{3+}$).

Various methods for producing a CeO$_2$—TiO$_2$ composite have been proposed or attempted. These include synthesis of a core shell Ce$_2$—TiO$_2$ photocatalyst via precipitation-co-hydrothermal dispersion of CeO$_2$ nanoparticles on anatase TiO$_2$; Zhang, J. Zhang, H. Jiu, X. Zhang, M. Xu, Journal of materials science, 50, 5228-5237 (2015); Luo, T.-D. Nguyen-Phan, A. C. Johnston-Peck, L. Barrio, S. Sallis, D. A. Arena, S. Kundu, W. Xu, L. F. Piper, E. A. Stach, The Journal of Physical Chemistry C, 119, 2669-2679 (2015). Fabrication of thin films of CeO$_2$—TiO$_2$ composite, for instance, via radio frequency (r.f.) reactive magnetron; B. Liu, X. Zhao, N. Zhang, Q. Zhao, X. He, J. Feng, Surface Science, 595, 203-211 (2005). Jiang et al, prepared CeO$_2$—TiO$_2$ composite films by a sol-gel process, dip-coating and calcination technique all targeting better interface contact for improved catalytic performance; B. Jiang, S. Zhang, X. Guo, B. Jin, Y. Tian, Applied Surface Science, 255 5975-5978 (2009).

Fabrication of layer by layer TiO$_2$/CeO$_2$ films via aerosol assisted chemical vapor deposition (AACVD) has been reported. However, the fabrication was a complicated multi-step process in which, CeO$_2$ layers were grown on top of the existing TiO$_2$ layers and the process was repeated multiple times so as to obtain an optimized photocatalytic performance. Multiple depositions steps were required in that study owing to the incompatibility of the TiO$_2$ and CeO$_2$ precursors in a homogenous solution; U. Qureshi, C. W. Dunnill, I. P. Parkin, Applied Surface Science, 256 852-856 (2009).

There remains a need for an uncomplicated, economical, single-step process to synthesize robust CeO$_2$—TiO$_2$ composite films with high interface contact and improved catalytic performance. The inventors believe that synergy for efficient charge separation, elongation of charge carrier lifetime, and enhanced photocatalytic activity of composite films is linked to producing a suitable interface contact in the microstructure and controlling a growth mechanism of a composite. Consequently, they sought new ways to simply and economically produce robust, stable, and functionally active composites by controlling the interplay between materials in a composite with a substrate and form novel heterointerfaces and other useful structural features.

BRIEF SUMMARY OF THE INVENTION

Among its other embodiments, the invention pertains to a method for making a homogenous CeO$_2$—TiO$_2$ composite film comprising chemical vapor deposition ("CVD") of a solution, which comprises metal trifluoroacetates of Ce and Ti, which can be produced by reacting trifluoroacetic acid (TFA) with triacetatocerium (III) hydrate and tetra iso-propoxytitanium (IV) in methanol, on a fluorine-doped tin oxide ("FTO") substrate at a temperature ranging from about 500 to about 650° C. as well as the Ce0r TiO2 composite per se, and methods of using this composite as a photocatalyst for a variety of different applications including production of hydrogen gas by water-splitting and for degradation of organic contaminants.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings below.

FIGS. 2A-2D: Low resolution (FIGS. 2A, 2C) and high resolution (FIGS. 2B and 2D) FE-SEM images of $CeO_2$—$TiO_2$ composite films deposited on FTO substrate at temperatures of (a) 550° C. (FIGS. 2A and 2B) and (b) 600° C. (FIGS. 2C and 2D) via AACVD.

FIGS. 3A-3H: EDX elemental maps showing the distribution of Ce, Ti, and O atoms in $CeO_2$—$TiO_2$ composite films made at 550 (FIGS. 3A-3D) and 600° C. (FIGS. 3E-3H).

(FIG. 4A). High resolution spectra for (FIG. 4B) Ti $2p$ (FIG. 4C) O 1s and (FIG. 4D) Ce $3d$.

FIGS. 5A and 5B (inset): UV-vis absorption spectrum of $CeO_2$—$TiO_2$ film deposited at 550° C. (FIG. 5A); resultant Tauc's plot $(\alpha h\nu)^2$ Vs $E_g$ for estimation of direct bandgap of $CeO_2$—$TiO_2$ film ($E_g$=2.6 eV)(FIG. 5B).

FIGS. 6A and 6B. Linear sweep voltammograms (LSVs) (FIG. 6A) and Chronoamperometry (I-t) profiles of $CeO_2$—$TiO_2$ composite photoanodes prepared at 550 and 600° C. (FIG. 6B).

DETAILED DESCRIPTION OF THE INVENTION

Figure 1:
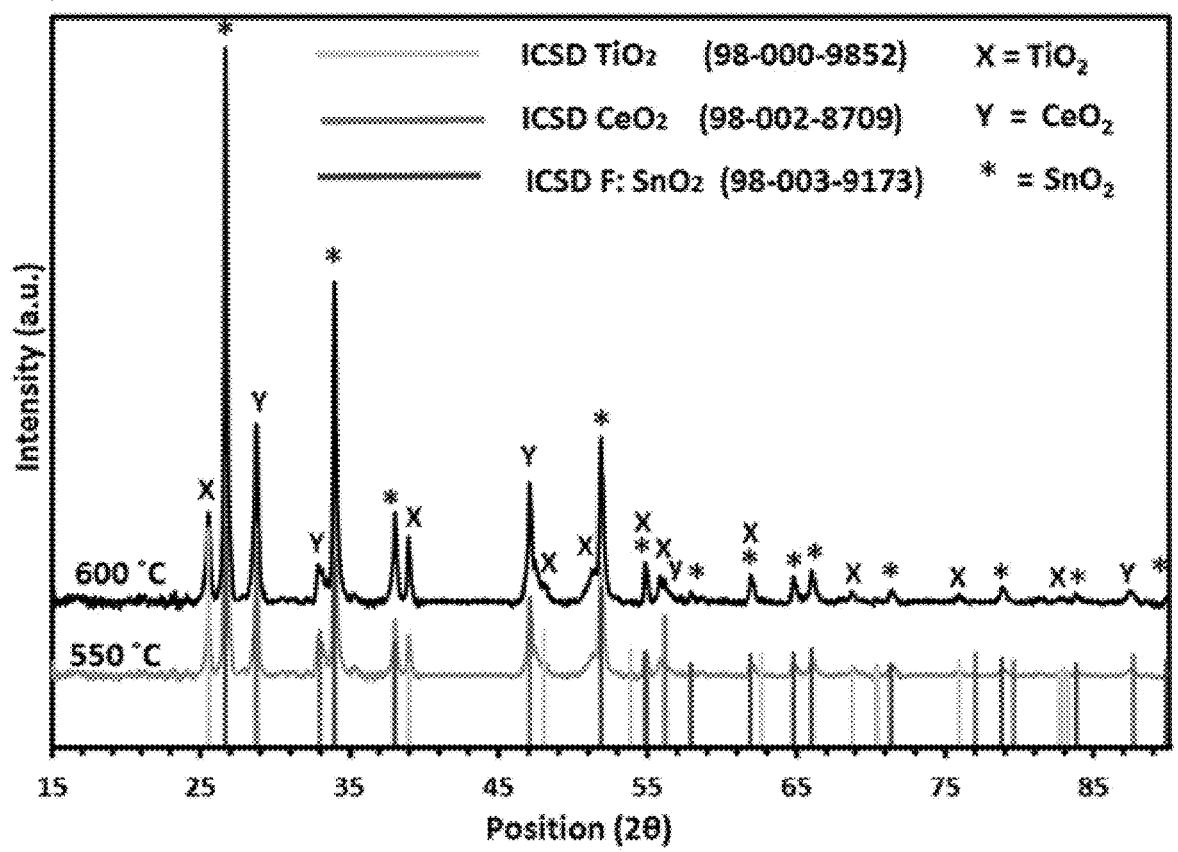
FIG. 1: XRD patterns of $Ce_2$—$TiO_2$ composite oxide films deposited on FTO glass substrate at temperatures of 550° C. (green line), 600° C. (black line) via AACVD in air atmosphere. Colored bar lines indicate the standard ICSD patterns.

As shown by the Examples below, the inventors have developed a simple single step deposition method for the growth of robust, durable and homogenous $CeO_2$—$TiO_2$ composite thin films and described the advantageous photoelectrochemical (PEC) properties of the films made by this novel protocol. A transparent methanol solution of triacetatocerium (III) hydrate and of tetraisopropoxytitanium (IV) precursors in 1:1 mole ratio was employed in aerosol assisted chemical vapor deposition (AACVD) on FTO substrates at temperatures of 550 and 600° C. in the ambient air. These precursors were converted into their trifluroacetates in situ, under these deposition conditions, for their compatibility in the AACVD procedure. XRD, SEM, EDX and XPS analyses verified the formation of uniformly dispersed crystalline $CeO_2$ and $TiO_2$ phases in spherical shaped morphologies and a direct bandgap of 2.6 eV was measured from the UV-visible spectrophotometry. PEC studies of the composite films revealed that the heterojunction developed between n-type $CeO_2$ and n-type $TiO_2$ facilitated the separation and transportation of electrons and holes, leading to a promising photocurrent density of about 1.0 mA cm$^{-2}$ and prolonged photo stability measured under one-sun illumination (100 mW cm$^{-2}$) which is up to 60 min at 0.7 V vs. Ag/AgCl. This behavior was further confirmed from electrochemical impedance spectroscopy and Bode phase angle measurements. The inventors also show that the composite films fabricated at about 550° C. had a higher porosity which provides larger interface contacts that generate higher photo activity.

Cerium and titanium substrates. Preferably, the cerium and titanium substrates used to make metal trifluoracetates comprise cerium (III) acetate hydrate ("$Ce(OAc)_3$.x $H_2O$") and titanium (IV) isopropoxide ("Ti($^i$Pro)$_4$") which are contacted with TFA in methanol to increase their solubility and form a substantially transparent solution that can be used as Ti and Ce sources for CVD or AACVD.

In alternative embodiments, the cerium or titanium substrates for CVD or AACVD do not comprise a trifluoroacetate ligand and may be composed of another ligand such as ethanol, acetate, isopropanol, tetrahydrofuran, salt thereof or water under conditions producing a substantially soluble suitable for CVD or AACVD and which product a substantially transparent solution.

In other alternative embodiments, cerium salts such as $Ce(C_5H_7O_2)_3$, $Ce_2O_3$, $CeCl_3$, or $Ce_2(C_2O_4)_3$ or another cerium compound may be used in place of or in addition to the cerium (III) acetate hydrate ($Ce(OAc)_3$.x $H_2O$).

In some alternative embodiments, instead of titanium (IV) isopropoxide the titanium precursor may be $TiB_2$, TiBr, TiC, $TiCl_4$, $Ti(ClO_4)_4$, $TiF_4$, $H_2TiF_6$, $TiH_4$, $TiI_4$, $Ti(NMe_2)_4$, $Ti(NO_3)_4$, $TiO_2$, $H_4TiO_4$, $Ti_4(OCH_2CH_3)_{16}$, $Ti(OCH_2CH_2CH_2CH_3)_4$, $KTiOPO_4$, $NiO.Sb_2O_3.20TiO_2$, $TiS_2$, $TiSe_2$, $TiSi_2$, titanium(IV) isopropoxide, or some other titanium compound.

Solvents.

Preferably, the solvent used in the method for making a $CeO_2$—$TiO_2$ composite as disclosed herein is methanol. In some alternative embodiments of the method, the solvent may be at least one of toluene, tetrahydrofuran, acetic acid, acetone, acetonitrile, butanol, dichloromethane, chloroform, chlorobenzene, dichloroethane, diethylene glycol, diethyl ether, dimethoxy-ethane, dimethyl-formamide, dimethyl sulfoxide, ethanol, ethyl acetate, ethylene glycol, heptane, hexamethylphosphoramide, hexamethylphosphorous triamide, methanol, methyl t-butyl ether, methylene chloride, pentane, cyclopentane, hexane, cyclohexane, benzene, dioxane, propanol, isopropyl alcohol, pyridine, triethyl amine, propandiol-1,2-carbonate, ethylene carbonate, propylene carbonate, nitrobenzene, formamide, γ-butyrolactone, benzyl alcohol, n-methyl-2-pyrrolidone, acetophenone, benzonitrile, valeronitrile, 3-methoxy propionitrile, dimethyl sulfate, aniline, n-methylformamide, phenol, 1,2-dichlorobenzene, tri-n-butyl phosphate, ethylene sulfate, benzenethiol, dimethyl acetamide, N,N-dimethylethaneamide, 3-methoxypropionnitrile, diglyme, cyclohexanol, bromobenzene, cyclohexanone, anisole, diethylformamide, 1-hexanethiol, ethyl chloroacetate, 1-dodecanthiol, di-n-butylether, dibutyl ether, acetic anhydride, m-xylene, o-xylene, p-xylene, morpholine, diisopropyl etheramine, diethyl carbonate, 1-pentandiol, n-butyl acetate, and/or 1-hexadecanthiol. In one embodiment, the solvent comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pentane, hexane, decalin, dioxane, benzene, toluene, xylene, o-dichlorobenzene, diethyl ether, methyl t-butyl ether, methanol, ethanol, ethylene glycol, isopropanol, propanol, and/or n-butanol. In a preferred embodiment, the solvent is methanol, acetone, ethanol, and/or isopropanol. More preferably the solvent consists of methanol or consists essentially of methanol or comprises methanol in combination with TFA or another agent for modifying the cerium and titanium precursors, such as cerium (III) acetate hydrate ($Ce(CH_3CO_2)_3 \cdot x\ H_2O$), and titanium (IV) isopropoxide ($Ti(O(CH_2)_3CH_3)_4$).

Aerosols.

Preferably the solvent and the cerium and titanium precursors are able to form a soluble solution that can be dispersed in a carrier gas as aerosol particles by CVD or AACVD. For instance, the cerium complex and/or titanium complex may first be dissolved in a volume of solvent, and then pumped through a jet nozzle in order to create an aerosol mist. In other embodiments, the mist may be generated by a piezoelectric ultrasonic generator. Other nebulizers and nebulizer arrangements may also be used, such as concentric nebulizers, cross-flow nebulizers, entrained nebulizers, V-groove nebulizers, parallel path nebulizers, enhanced parallel path nebulizers, flow blurring nebulizers, and piezoelectric vibrating mesh nebulizers. In one embodiment, the mixtures of the cerium complex (e.g., trifluoroacetate of cerium) and solvent (e.g., methanol) and the titanium complex (e.g., trifluoroacetate of titanium) and solvent, are introduced as separate aerosols, for instance, produced by separate nozzles or nebulizers. Preferably, however, the cerium complex and titanium complex are mixed together in the same solvent prior to producing the aerosol.

In one embodiment, the aerosol may have a mass concentration M, of 10, 20, 50, 100, 200, 500 to 1,000 $mg/m^3$. In another embodiment, the aerosol may have a number concentration N, in a range of $10^3$-$10^6$, preferably 104-105 $cm^{-3}$. In other embodiments, the aerosol may have a number concentration of less than $10^3$ or greater than $10^6$.

The aerosol particles or droplets may have an equivalent volume diameter ($d_e$) in a range of 20, 30, 40, 50, 60, 70, 80, 90 or 100 μm, preferably 0.5-70 μm, more preferably 1-50 μm, though in some embodiments, aerosol particles or droplets may have an average diameter of smaller than 0.2 μm or larger than 100 μm.

In one embodiment, the carrier gas is $N_2$, He, compressed air, and/or Ar. Preferably the carrier gas is compressed air.

In a related embodiment, before the contacting and/or depositing, the aerosol consists essentially of the carrier gas, the solvent, the cerium complex and the titanium complex, meaning that at least 99.9 wt %, preferably at least 99.99 wt %, or 100 wt % of the aerosol is carrier gas, solvent, cerium complex and titanium complex (e.g., typically metal trifluoroacetates), relative to a total weight of the aerosol.

In one embodiment, the aerosol is contacted with the substrate for a time period of 10, 20, 30, 60, 90 to 120 min, preferably 20-100 min, more preferably 30-90 min, even more preferably 45-75 min, or about 60 min. However, in some embodiments, the aerosol may be contacted with the substrate for a time period of less than 10 min or greater than 120 min.

In one embodiment, during the contacting of the aerosol, the carrier gas has a flow rate in a range of 0.1 to 10 mL/s, preferably 0.5 to 7.5 mL/s, more preferably 1.5 to 5.0 mL/s, even more preferably 2.0-4.0 mL/s, or about 2.5 mL/s (equivalently 150 $cm^3$/min). However, in some embodiments, the carrier gas flow rate may be less than 0.1 mL/s or greater than 10 mL/s. Preferably, the aerosol has a flow rate similar to the carrier gas, with the exception of the portion of aerosol that gets deposited on the substrate. In one embodiment, the aerosol may enter the chamber and the flow rate may be stopped, so that a portion of aerosol may settle on the substrate.

In one embodiment, the aerosol is contacted with the substrate in a reaction chamber. In another embodiment, the flow of the carrier gas and aerosol may have a gas hourly space velocity in a range of 10, 20, 50, 100, 200, 500 to 1,000 $h^{-1}$, preferably 50-500 $h^{-1}$, more preferably 100-130 $h^{-1}$.

The contacting and/or introducing may take place within a closed chamber or reactor, and the aerosol may be generated by dispersing a solution of the cerium and/or titanium complex and solvent. In one embodiment, this dispersing may be increased by fans, jets, or pumps. However, in another embodiment, an aerosol may be formed in a closed chamber with a substrate where the aerosol particles are allowed to diffuse towards or settle on the substrate. The substrate may have an area in a range of 0.5-4 $cm^2$, preferably 1.0-3 $cm^2$, more preferably 1.5-3 $cm^2$. In one embodiment, the closed chamber or reactor may have a length of 10-100 cm, preferably 12-30 cm, and a diameter or width of 1-10 cm, preferably 2-5 cm. In other embodiments, the closed chamber or reactor may have an interior volume of 0.2-100 L, preferably 0.3-25 L, more preferably 0.5-10 L. In one embodiment, the closed chamber or reactor may comprise a cylindrical glass vessel, such as a glass tube.

Being in a closed chamber, the interior pressure of the chamber and thus the pressure of the aerosol may be controlled. The pressure may be practically unlimited, but need not be an underpressure or an overpressure. Preferably the chamber and substrate are heated and held at a temperature prior to the contacting, so that the temperature may stabilize. The chamber and substrate may be heated for a time period of 5 min-1 hr, preferably 10-20 min prior to the contacting.

In one embodiment, during the contacting of the aerosol, a $CeO_2$—$TiO_2$ composite layer may form at a rate of 0.1 to 20, 0.2 to 18, 0.4 to 16, 0.5 to 14, 0.6 to 12, 0.7 to 10, 0.8 to 9, 3 to 15, 1.0 to 8, 1.5 to 5, or 2 to 3 nm/s, and/or at least 0.01, 0.05, 0.1, 0.2, 0.4, 0.5, 0.6, 0.8, 1.0, 1.5, 1.75, 2, 2.5, 3.33, 3.5, 4, 4.5, 5, 6.5, 7, 7.5, 7.75, 8, 8.25, 8.5, 8.75, 9, or 10 nm/s.

In one embodiment, the method of making the composite thin film electrode may further comprise a step of cooling the composite thin film electrode after the contacting. The composite thin film may be cooled to a temperature between 10 to 45° C., 20 to 40° C., or 25 to 35° C. under an inert gas (such as $N_2$ or Ar) over a time period of 0.5 to 5 h, 0.75 to 4 h, 1 to 3 h, 1.25 to 2.5 h, or 1.5 to 2 h.

Structural Forms of a Homogenous $CeO_2$—$TiO_2$ Composite.

The composites as disclosed herein may in the form of a film, foil, strip, layer, coating, sheet, plate, corrugated or grooved plate or sheet, cast part, fiber, particle or cast or extruded form. The composition may form a complete or partial coating, such as a coating having holes or pinholes or a patterned coating such as a striped, grid shaped, or other patterned coating. It may also be applied as a speckled finish and may be applied to particles of a substrate, for example as an outer coating. Advantageously, it is applied as a homogenous film. In some embodiments, the homogenous $CeO_2$—$TiO_2$ composite may be applied to a flat or smooth substrate. In other embodiments it may be applied to a rough or textured substrate. In still others it may be applied to a particulate substrate, such as to silica, ferrite or other types of magnetic particles or to a fiber. The thickness of a film, coating or thin layer of the invention may range from <10, 10, 20, 50, 100, 200, 500 or >500 nm or any intermediate subrange or value of this range. In some alternative embodiments, the uniformly dispersed crystalline $CeO_2$ and $TiO_2$ phases may present morphologies, such as hollow spheres, flower-shaped forms, or ordered mesoporous structures.

Electrodes.

Another aspect of the invention relates to an electrochemical cell, which is made of the composite thin film electrode of $CeO_2$—$TiO_2$ composite, a counter electrode, and an electrolyte solution in contact with both electrodes.

In one embodiment, the electrochemical cell is a vessel having an internal cavity for holding the electrolyte solution. The vessel may be cylindrical, cuboid, frustoconical, spherical, or some other shape. The vessel walls may comprise a material including, but not limited to, glass, polypropylene, polyvinyl chloride, polyethylene, and/or polytetrafluoroethylene, and the vessel walls may have a thickness of 0.1-3 cm, preferably 0.1-2 cm, more preferably 0.2-1.5 cm. The internal cavity may have a volume of 2 mL-100 mL, preferably 2.5 mL-50 mL, more preferably 3 mL-20 mL. In another embodiment, for instance, for small scale or benchtop anodization, the internal cavity may have a volume of 100 mL-50 L, preferably 1 L-20 L, more preferably 2 L-10 L. In another embodiment, for instance, for pilot plant anodization, the internal cavity may have a volume of 50 L-10,000 L, preferably 70 L-1,000 L, more preferably 80 L-2,000 L. In another embodiment, for instance, for industrial plant-scale anodization, the internal cavity may have a volume of 10,000 L-500,000 L, preferably 20,000 L-400,000 L, more preferably 40,000 L-100,000 L. In one embodiment, one or more electrochemical cells may be connected to each other in parallel and/or in series. In another embodiment, the electrolyte solution may be in contact with more than composite thin film electrode and/or more than one counter electrode.

The counter electrode may comprise platinum, gold, or some other Noble metal such as ruthenium (Ru), rhodium (Rh), palladium (Pd), silver (Ag), osmium (Os), or iridium (Ir). Preferably the counter electrode is a platinum wire. The counter electrode may also be called an auxiliary electrode. Unless otherwise noted, the phrase "the electrodes" refers to both the composite thin film electrode and the counter electrode.

In one embodiment, the counter electrode comprises gold, platinum, or carbon. In a further embodiment, the counter electrode comprises platinum. In one embodiment, the counter electrode may be in the form of a wire, a rod, a cylinder, a tube, a scroll, a sheet, a piece of foil, a woven mesh, a perforated sheet, or a brush. The counter electrode may be polished in order to reduce surface roughness or may be texturized with grooves, channels, divots, microstructures, or nanostructures.

In another further embodiment, where the counter electrode comprises platinum, the counter electrode is in the form of rod or wire. Alternatively, the counter electrode may comprise some other electrically-conductive material such as platinum-iridium alloy, iridium, titanium, titanium alloy, stainless steel, gold, cobalt alloy and/or some other electrically-conductive material, where an "electrically-conductive material" as defined here is a substance with an electrical resistivity of at most $10^{-6}$ $\Omega \cdot m$, preferably at most $10^{-7}$ $\Omega \cdot m$, more preferably at most $10^{-8}$ $\Omega \cdot m$ at a temperature of 20-25° C.

In a preferred embodiment, the counter electrode has at least one outer surface comprising an essentially inert, electrically conducting chemical substance, such as platinum, gold, or carbon. In another embodiment, the counter electrode may comprise solid platinum, gold, or carbon. The form of the counter electrode may be generally relevant only in that it needs to supply sufficient current to the electrolyte solution to support the current required for electrochemical reaction of interest. The material of the counter electrode should thus be sufficiently inert to withstand the chemical conditions in the electrolyte solution, such as acidic or basic pH values, without substantially degrading during electrochemical or photoelectrochemical processes. The counter electrode preferably should not leach out any chemical substance that interferes with the electrochemical reaction or might lead to undesirable contamination of either electrode.

In a further embodiment, where the counter electrode comprises platinum, the counter electrode may be in the form of a mesh. In one embodiment, the counter electrode in the form of a mesh may have a nominal aperture or pore diameter of 0.05-0.6 mm, preferably 0.1-0.5 mm, more preferably 0.2-0.4 mm, and/or a wire diameter of 0.01-0.5 mm, preferably 0.08-0.4 mm, more preferably 0.1-0.3 mm. In other embodiments, the counter electrode may be considered a gauze with a mesh number of 40-200, preferably 45-150, more preferably 50-100. In other embodiments, the counter electrode may be in the form of a perforated sheet or a sponge. In one embodiment, the counter electrode may be in the form of a mesh with one or more bulk dimensions (length, width, or thickness) as previously described.

Preferably, the counter electrode is in the form of a rod or wire. The rod or wire may have straight sides and a circular cross-section, similar to a cylinder. A ratio of the length of the rod or wire to its width may be 1,500:1-1:1, preferably 500:1-2:1, more preferably 300:1-3:1, even more preferably 200:1-4:1. The length of the rod or wire may be 0.5-50 cm, preferably 1-30 cm, more preferably 3-20 cm, and a long wire may be coiled or bent into a shape that allows the entire wire to fit into an electrochemical cell. The diameter of the rod or wire may be 0.5-20 mm, preferably 0.8-8 mm, more preferably 1-3 mm. In some embodiments, a rod may have an elongated cross-section, similar to a ribbon or strip of metal.

Preferably the electrochemical cell also includes a reference electrode in contact with the electrolyte solution. A reference electrode is an electrode which has a stable and well-known electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a standard hydrogen electrode (SHE), a normal hydrogen electrode (NHE), a reversible hydrogen electrode (RHE), a saturated calomel electrode (SCE), a copper-copper(II) sulfate electrode (CSE), a silver chloride electrode (Ag/AgCl), a pH-electrode, a palladium-hydrogen electrode, a dynamic hydrogen electrode (DHE), a mercury-mercurous sulfate electrode, or some other type of electrode. In a preferred embodiment, a reference electrode is present and is a silver chloride electrode (Ag/AgCl).

In one embodiment, the electrolyte solution comprises water and an inorganic base The inorganic base may be NaOH, KOH, LiOH, Mg(OH)$_2$, Ca(OH)$_2$, Ba(OH)$_2$, NH$_4$OH, or some other inorganic base. Preferably the inorganic base is NaOH. In alternative embodiments, an organic base may be used, such as sodium carbonate or sodium acetate. The inorganic base may have a concentration of 0.5-1.5 M, preferably 0.75-1.25 M, more preferably 0.9-1.1 M, or about 1.0 M. In other embodiments, the electrolyte solution may comprise some other salt, in addition to or in place of the inorganic base. The salt may comprise at least one cation selected from the group consisting of K$^+$, Na$^+$, Li$^+$, Cu$^{2+}$, Ag$^+$, Ni$^{2+}$, C$^{2+}$, Co$^{3+}$, Zn$^{2+}$, Sn$^{2+}$, Pb$^{2+}$, Fe$^{2+}$, Fe$^{3+}$, Cr$^{2+}$, and Cr$^{3+}$. The counter ion of the salt may be SO$_4^{2-}$, Br$^-$, NO$_3^-$, OH$^-$, Cl$^-$, acetate, or some other anion. The salt may have a concentration of 0.02-1.0 M, preferably 0.05-0.8 M, more preferably 0.08-0.5 M, or about 0.1 M, though in some embodiments, the concentration may be less than 0.02 M or greater than 1.0 M.

In a preferred embodiment, the electrolyte solution may have a total volume of 1 mL-10 L, preferably 5 mL-1 L, more preferably 10 mL-500 mL, even more preferably 15 mL-300 mL.

In one embodiment, the composite thin film electrode has a width and/or length in contact with the electrolyte solution of 0.1-5.0 cm, preferably 0.3-4.0 cm, more preferably 0.5-3.0. The composite thin film electrode may have a surface area of 0.5-10 cm$^2$, preferably 0.7-5 cm$^2$, more preferably 1-3 cm$^2$ in contact with the electrolyte solution.

In one embodiment, the composite thin film electrode has a current density of up to about ~1000 μA cm$^{-2}$, preferably 0.50-0.70 mA/cm$^2$, more preferably 0.55-0.65 mA/cm$^2$, or about 0.61 mA/cm$^2$ when the electrodes are subjected to a bias potential of 0.6-0.8 V and an illumination power density of 80-150 mW/cm$^2$, 90-110 mW/cm$^2$, preferably 95-105 mW/cm$^2$, more preferably 98-102 mW/cm$^2$, or about 100 mW/cm$^2$.

Photocatalytic process applications. Photocatalytic materials are semiconductors in which, when exposed to light, electron-hole pairs are formed that generate highly reactive free radicals on the material surface. Applications of the materials produced as described herein include conversion of water to hydrogen gas by photocatalytic water splitting, use of free radicals generated by a photocatalyst to degrade organic compounds or materials, decomposition of crude oil or other hydrocarbons, or decontamination of water containing organic compounds such as dyes or tetrachloroethylene. Photocatalytic degradation may be used to process or decontaminate materials containing explosives such as TNT, RDX and HMX or chemical residues produced during the production of explosives such as contaminated military red water. Other applications include selective catalytic reduction (SCR) is a means of converting nitrogen oxides, also referred to as NO x with the aid of the composite disclosed herein into diatomic nitrogen and water. A gaseous reductant, typically anhydrous ammonia, aqueous ammonia or urea, is added to a stream of flue or exhaust gas and is adsorbed onto a catalyst. Another application involves the use of the composites disclosed herein for the conversion of carbon dioxide into gaseous hydrocarbons in the presence of water, Other applications include uses as self-sterilizing photocatalytic coatings to an instrument, tool, equipment or apparatus, such as surgical instruments or other medical or dental equipment or tools.

The homogenous CeO$_2$—TiO$_2$ composite film or coating of the invention may be employed in conjunction with photonic radiation, such as UV light or sunlight, for one or more of these applications.

Photocatalytic Water-Splitting.

In general, photocatalytic water splitting is an artificial photosynthesis process with photocatalysis in a photoelectrochemical cell used for the dissociation of water into its constituent parts, H$_2$ and O$_2$, using either artificial or natural light. Here, this method involves irradiating the electrochemical cell of the third aspect with sunlight. Alternatively, the electrochemical cell may be irradiated with light from a gas discharge lamp (such as a mercury vapor lamp, a xenon lamp, an argon lamp, or a metal halide lamp), a laser, an LED, and/or an incandescent bulb. In one embodiment, a lamp as a solar simulator may be used.

In one embodiment, the solar simulator output to the composite thin film electrode may be 40-160 mW/cm$^2$, preferably 50-150 mW/cm$^2$, more preferably 90-110 mW/cm$^2$, or about 100 mW/cm$^2$.

During the irradiating, a bias voltage of 0.5-0.9 V, preferably 0.6-0.8 V, or about 0.7 V may be applied to the composite thin film electrode and the counter electrode.

Preferably the composite thin film electrode functions as the cathode, receiving a negative potential to reduce water into H$_2$ gas and OH$^-$, while the counter electrode functions as the anode, receiving a positive potential to oxidize OH$^-$ into O$_2$ gas and H$_2$O. This is summarized by the following reactions:

Cathode (reduction): $2H_2O_{(l)} + 2e^- \rightarrow H_{2(g)} + 2OH^-_{(aq)}$

Anode (oxidation): $4OH^-_{(aq)} \rightarrow O_{2(g)} + 2H_2O_{(l)} + 4e^-$

Overall reaction: $2H_2O_{(l)} \rightarrow 2H_{2(g)} + O_{2(g)}$

In another embodiment, the potentials may be switched, wherein the composite thin film electrode functions as the anode and receives a positive potential, and the counter electrode functions as the cathode and receives a negative potential. In an alternative embodiment, the electrodes may be subjected to an alternating current (AC) in which the anode and cathode roles are continually switched between the two electrodes.

In one embodiment, the potential may be applied to the electrodes by a battery, such as a battery comprising one or more electrochemical cells of alkaline, lithium, lithium-ion, nickel-cadmium, nickel metal hydride, zinc-air, silver oxide, and/or carbon-zinc. In another embodiment, the potential may be applied through a potentiostat or some other source of direct current, such as a photovoltaic cell. In one embodiment, a potentiostat may be powered by an AC adaptor, which is plugged into a standard building or home electric utility line. In one embodiment, the potentiostat may connect with a reference electrode in the electrolyte solution. Preferably the potentiostat is able to supply a relatively stable voltage or potential. For example, in one embodiment, the electrochemical cell is subjected to a voltage that does not vary by more than 5%, preferably by no more than 3%, preferably by no more than 1.5% of an average value throughout the subjecting. In another embodiment, the voltage may be modulated, such as being increased or decreased linearly, being applied as pulses, or being applied with an alternating current. Preferably, the composite thin film electrode may be considered the working electrode with the counter electrode being considered the auxiliary electrode. However, in some embodiments, the composite thin film electrode may be considered the auxiliary electrode with the counter electrode being considered the working electrode.

In one embodiment, the method further comprises the step of separately collecting H$_2$-enriched gas and O$_2$-enriched gas. In one embodiment, the space above each electrode may be confined to a vessel in order to receive or store the evolved gases from one or both electrodes. The collected gas may be further processed, filtered, or compressed. Preferably the $H_2$-enriched gas is collected above the cathode, and the $O_2$-enriched gas is collected above the anode. The electrolytic cell, or an attachment, may be shaped so that the headspace above the composite thin film electrode is kept separate from the headspace above the reference electrode. In one embodiment, the $H_2$-enriched gas and the $O_2$-enriched gas are not 100 vol % $H_2$ and 100 vol % $O_2$, respectively. For example, the enriched gases may also comprise $N_2$ from air, and water vapor and other dissolved gases from the electrolyte solution. The $H_2$-enriched gas may also comprise $O_2$ from air. The $H_2$-enriched gas may comprise greater than 20 vol % $H_2$, preferably greater than 40 vol % $H_2$, more preferably greater than 60 vol % $H_2$, even more preferably greater than 80 vol % $H_2$, relative to a total volume of the receptacle collecting the evolved $H_2$ gas. The $O_2$-enriched gas may comprise greater than 20 vol % $O_2$, preferably greater than 40 vol % $O_2$, more preferably greater than 60 vol % $O_2$, even more preferably greater than 80 vol % $O_2$, relative to a total volume of the receptacle collecting the evolved $O_2$ gas. In some embodiments, the evolved gases may be bubbled into a vessel comprising water or some other liquid, and higher concentrations of $O_2$ or $H_2$ may be collected. In one embodiment, evolved $O_2$ and $H_2$, or $H_2$-enriched gas and $O_2$-enriched gas, may be collected in the same vessel.

Several parameters for the method for decomposing water may be modified to lead to different reaction rates, yields, and other outcomes. These parameters include, but are not limited to, electrolyte type and concentration, pH, pressure, solution temperature, current, voltage, stirring rate, electrode surface area, size of $CeO_2$—$TiO_2$ composite particles, thickness of the $CeO_2$—$TiO_2$ composite layer, and exposure time. A variable DC current may be applied at a fixed voltage, or a fixed DC current may be applied at a variable voltage. In some instances, AC current or pulsed current may be used. A person having ordinary skill in the art may be able to adjust these and other parameters, to achieve different desired nanostructures. In other embodiments, the electrochemical cell may be used for other electrochemical reactions or analyses.

In an alternative embodiment, the composite thin film electrode may be used in the field of batteries, fuel cells, photochemical cells, water splitting cells, electronics, water purification, hydrogen sensors, semiconductors (such as field effect transistors), magnetic semiconductors, capacitors, data storage devices, biosensors (such as redox protein sensors), photovoltaics, liquid crystal screens, plasma screens, touch screens, OLEDs, antistatic deposits, optical coatings, reflective coverings, anti-reflection coatings, and/or reaction catalysis. Similarly, in one embodiment, the composite thin film electrode may be coated with another material. For example, the composite thin film electrode may be coated with a layer of gold. A gold-coated composite thin film electrode may then be used for analyte detection using surface enhanced Raman scattering (SERS).

Photon Sources for Photocatalysis or Water Splitting.

Artificial UV or visible light lamps and sunlight can be used as radiation sources for a photocatalytic process. Artificial UV lamps containing mercury are the most commonly used source of UV irradiation. These can be divided into low pressure mercury lamp, medium pressure mercury lamp and high pressure mercury lamp. Sunlight has also been used in the photocatalytic process as nearly 4-5% of the sunlight that reaches the earth's surface is in the 300-400 nm near UV light range. The source of the illumination may be a solar simulator that may use a xenon arc lamp or a halogen lamp. In one embodiment, the radiation source may be fitted with a dichroic reflector and/or an optical filter in order to better reproduce solar light illumination, such as illumination having an AM1.5G spectrum, which may be known as the "global standard" spectrum.

Embodiments of the invention include, but are not limited to the following.

One embodiment of the invention is a method for making a homogenous $CeO_2$—$TiO_2$ composite film comprising chemical vapor deposition ("CVD") of a Ce and Ti metal trifluoroacetate solution on a fluorine-doped tin oxide ("FTO") substrate at a temperature ranging from <500, 500, 510, 520, 530, 540, 550, 560, 570, 580, 590, 600, 610, 620, 630, 640, 650 to >650° C. Preferably, the temperature will range between 550 and 600° C. and most preferably about 550° C. for production of a mesoporous composite.

The metal trifluoroacetate solution contains Ce and Ti, preferably at a molecular or atomic ratio of 1.2:1 to 1:1.2, 1.1:1 to 1:1.1, 1.05:1 to 1:1.05 and most preferably about 1:1. In a preferred embodiment, the metal trifluoroacetate solution is made by reacting triacetatocerium (III) hydrate and tetra isopropoxytitanium (IV) with TFA in methanol to produce the Ce and Ti trifluoroacetates.

The composite film typically comprises mesoporous or smooth microspheres having an average diameter ranging from about <0.8, 0.8, 0.9, 1.0, 1.1, 1.2, 1.3, 1.4, 1.5, 1.6, 1.7, 1.8, 1.9, 2.0, 2.1 to >2.1 μm. Mesoporous microspheres form at a lower temperatures such as at about 550° C. while smoother microspheres form at higher temperatures such as at 600° C. A film made at about 550° C. exhibited higher current density compared to a similar film made at 600° C.

In preferred embodiments of this method, the homogenous $CeO_2$—$TiO_2$ composite film is produced by reaction of the metal triflouroacetates of triacetatocerium (III) hydrate and tetra isopropoxytitanium (IV) on the surface of the fluorine-doped tin oxide ("FTO") substrate. This produces a homogenous $CeO_2$—$TiO_2$ composite film by a single step of chemical vapor deposition ("CVD") of a uniform solution containing both the Ce and Ti metal trifluoroactates. The deposition may occur at a temperature ranging from 500 to 650° C. in air.

In some embodiments, the composite as deposited on the substrate will consist, consist essentially of or comprise a homogenous $CeO_2$—$TiO_2$ composite. In some embodiments, the homogenous $CeO_2$—$TiO_2$ composite may contain other semiconductor oxides.

Advantageously, the homogenous $CeO_2$—$TiO_2$ composite film is formed by a single step of CVD or AACVD of a uniform solution containing both the Ce trifluoracetate and Ti trifluoracetate without separate depositions of the Ce and Ti solutions and without further dispersion or coating step and without further heat or chemical treatments.

In some embodiments, the tin oxide substrate may be doped with fluorine, chlorine, bromine, or iodine or with other anions. A doped substrate containing tin oxide may be used such as indium tin oxide (ITO). In other embodiments, other substrates may be used such as those comprising FTO, AZO, GZO, IZO, IZTO, IAZO, IGZO, IGTO, and ATO as well as halogen-doped types of these substrates. In one embodiment, the substrate is a transparent is selected from the group consisting of ITO (indium tin oxide), FTO (fluorine-doped tin oxide), AZO (aluminum-doped zinc oxide), GZO (gallium-doped zinc oxide), IZO (indium zinc oxide), IZTO (indium zinc tin oxide), IAZO (indium aluminum zinc oxide), IGZO (indium gallium zinc oxide), IGTO (indium gallium tin oxide), and ATO (antimony tin oxide). Typically, the substrate is in the form of a thin film or layer, but other forms as described herein may be used.

The doped tin oxide substrate (or other substrate type) may be applied to, layered or laminated to another substrate, such as a metal, silicon, metal oxide, semiconductor, ceramic, glass or plastic substrate prior to CVD of the solution of triacetatocerium (III) hydrate and tetra isopropoxytitanium (IV). FTO substrate is commercially available from Sigma-Aldrich.

In preferred embodiments, this method is performed using chemical vapor deposition that is aerosol-assisted chemical vapor deposition ("AACVP").

In the method disclosed herein, the solution is a methanol solution which comprises triacetatocerium (III) hydrate and tetra isopropoxytitanium (IV) in a molar ratio that when reacted with TFA produces a homogenous or clear solution. Exemplary ratios of these ingredients range from about 1.0-1.5:1 to about 1.5:1 or any intermediate ratio such as 1.0:1.0, 1.05:1, 1.1:1.0, 1.2:1.0, 1.3:1.0, 1.4:1.0, 1.5:1.0; 1:1.05, 1.0:1.1, 1.0:1.2, 1:0:1.3, 1.0:1.4 or 1.0:1.5. Preferably a ratio of the above ingredients is about 1:1.

In some embodiments, this method further includes a step of modifying cerium and titanium precursors to form their metal trifluoroacetates by reacting them with trifluoroacetic acid in methanol for a time and under conditions producing a homogeneous solution. For example, it includes modifying cerium (III) acetate hydrate ($Ce(CH_3CO_2)_3 \cdot x\ H_2O$), and titanium (IV) isopropoxide ($Ti(O(CH_2)_3CH_3)_4$) into their metal trifluoroacetates by reacting them with trifluoroacetic acid in methanol for a time and under conditions for producing a homogeneous or clear solution.

The methods disclosed herein may be performed at a temperature ranging from about 540, 545, 550, 555, 560 to 565° C. as this can produce a film containing mesoporous microspheres with pore size ranging from about 10, 15, 20, 25, 28, to 30 nm in diameter. In another embodiment, the methods disclosed herein may be performed at a higher temperature such as at 570, 575, 580, 585, 590, 595, 600, 605 or 610° C., as this can produce a film that comprises microspheres with a smoother, non-porous texture.

In some embodiments, the particles forming a $CeO_2$—$TiO_2$ composite are substantially spherical, meaning that the distance from the particle centroid to anywhere on the outer surface varies by less than 30%, preferably less than 20%, or less than 10%. In alternative embodiments, one or more $CeO_2$—$TiO_2$ composite particles may be shaped like cylinders, boxes, spikes, flakes, plates, ellipsoids, toroids, stars, ribbons, discs, rods, granules, prisms, cones, flakes, platelets, sheets, or some other shape. In one embodiment, the individual $CeO_2$—$TiO_2$ composite particles comprise both $CeO_2$ and $TiO_2$. In an alternative embodiment, some $Ce_2$—$TiO_2$ composite particles may comprise some particles with a higher concentration of $CeO_2$ than the bulk average and may comprise other particles with higher concentration of $TiO_2$ than the bulk average. In one embodiment, individual $CeO_2$—$TiO_2$ composite particles may be considered nanocomposites, where the particle has regions of $CeO_2$ and $TiO_2$ interspersed throughout the particle. These regions maybe considered nanodomains, and may have an average diameter in a range of 10, 20, 30, 40, 50, 60, 70, 80, 90-100 nm, or ranging between 15-90 nm, or 20-80 nm.

In one embodiment, the $CeO_2$—$TiO_2$ composite particles may have an average diameter or average longest dimension in a range of 0.2-2.2 µm, preferably 0.4-1.5 µm, more preferably 0.5-1.0 µm, or about 0.75 µm. However, in alternative embodiments, the $CeO_2$—$TiO_2$ composite particles may have an average diameter or average longest dimension of less than 0.2 µm or greater than 2.2 µm.

In one embodiment, the $CeO_2$—$TiO_2$ composite particles may have an average Wadell sphericity value in a range of 0.3 to 0.9, or 0.3 to 0.8. The Wadell sphericity of a particle is defined by the ratio of the surface area of a sphere (which has the same volume as the given particle) to the surface area of the particle. The values of Wadell sphericity range from 0 to 1, where a value of 1 is a perfect sphere, and particles become less spherical as their sphericity approaches a value of 0. The Wadell sphericity may be approximated by $$\Psi \approx \left(\frac{bc}{a^2}\right)^{1/3},$$

where a, b, and c are the lengths of the long, intermediate, and short axes, respectively of an individual particle.

In one embodiment, the $CeO_2$—$TiO_2$ composite particles are monodisperse, having a coefficient of variation or relative standard deviation, expressed as a percentage and defined as the ratio of the particle diameter standard deviation (σ) to the particle diameter mean (µ), multiplied by 100%, of less than 25%, preferably less than 10%, preferably less than 8%, preferably less than 6%, preferably less than 5%. In a preferred embodiment, the $CeO_2$—$TiO_2$ composite particles are monodisperse having a particle diameter distribution ranging from 80% of the average particle diameter to 120% of the average particle diameter, preferably 85-115%, preferably 90-110% of the average particle diameter. In another embodiment, the $CeO_2$—$TiO_2$ composite particles are not monodisperse.

Another embodiment of the invention is a homogenous $CeO_2$—$TiO_2$ composite thin film comprising uniformly dispersed crystalline $CeO_2$ and $TiO_2$ phases and having a thickness suitable for the applications described herein such as photocatalysis of organic molecules or water-splitting. In some embodiments the thickness of the film is no more than 10, 20, 30, 40, 50, 60, 70, 80, 90, 100, 120, 150, 200, 300, 400, 500, 600, 700, 800, 900, 1,000 nm, >1 µm, 2, 3, 4, 5 or >5 µm. The homogenous $CeO_2$—$TiO_2$ composite thin film described herein may further contain porous heterojunctions of $CeO_2$—$TiO_2$ which have substantially spheroidal or spherical shaped morphologies. In some embodiments, the film may range in thickness from about 3 to 5 µm. The film thickness has great influence on its PEC performance. For example, if the layer is too thick, the majority carrier would not be able to diffuse into the layer leading to a hindered access to the surface of the FTO electrode. This reduces the charge transport properties which would result in limited photocurrent density. Therefore, the thickness of the film can be selected to closely match with the majority carrier diffusion length of the electrode for better charge separation and fast charge transport mechanism for higher photocurrent response.

In some embodiments, the homogenous $CeO_2$—$TiO_2$ composite thin film described herein will have a bandgap less than either pristine $CeO_2$ or pristine $TiO_2$. In a preferred embodiment the homogenous $CeO_2$—$TiO_2$ composite thin film has a bandgap ranging from 2.5 to 2.7 eV or about 2.6 eV.

Figure 8:
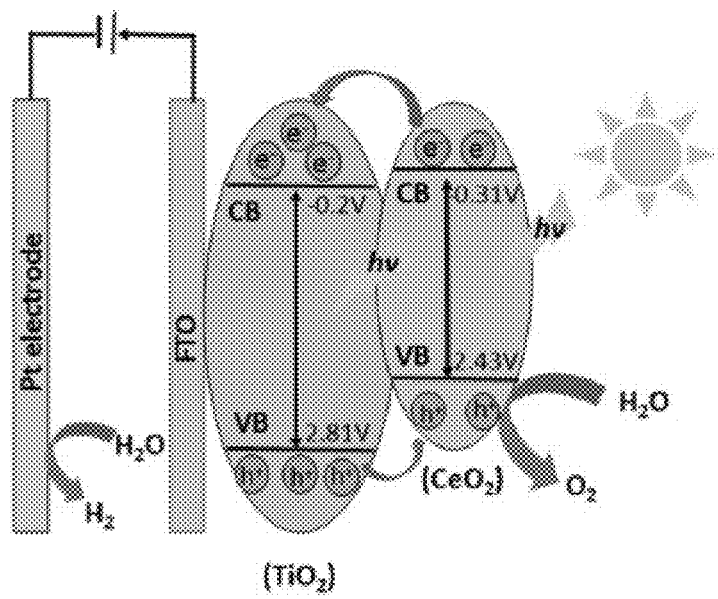
FIG. 8. Schematic diagram showing hole-trapping and electron transfer mechanisms for $CeO_2$—$TiO_2$ composite thin films exposed to sunlight.

Other embodiments of the invention include electrodes or photoelectrochemical cells comprising the homogenous $CeO_2$—$TiO_2$ composite described herein, preferably in the form of a film. The invention is also directed to an apparatus for splitting water into hydrogen and oxygen that comprises photoelectrochemical cells comprising the homogenous $CeO_2$—$TiO_2$ composite. FIG. 8 diagrams a water-splitting process.

Another embodiment of the invention is a method for splitting water into hydrogen and oxygen comprising contacting it with the photocatalyst comprising the homogenous $CeO_2$—$TiO_2$ composite in the presence of visible light and/or UV light. Water-splitting reactors, which may be modified by incorporation of the $CeO_2$—$TiO_2$ composite as disclosed herein, include those described and reviewed by Hisatomi, et al., Nature Catalysis (March, 2019) https://doi.org/10.1038/s41929-019-0242-6 (incorporated by reference). The $CeO_2$—$TiO_2$ composite disclosed herein may be incorporated into such a reactor as a thin film, which may be further supported by a thick film or other support matrix that is exposed to a source of UV or visible light radiation.

Another embodiment of the invention is directed to a photocatalytic reactor that includes the homogenous $CeO_2$—$TiO_2$ composite as disclosed herein. Such a reactor may be used for degrading an aromatic compound or other organic compound comprising contacting it with homogenous $Ce_2$—$TiO_2$ composite in the presence of visible and/or UV light. The reactor may include intakes for a contaminated fluid, such as waste water containing an organic pollutant, pumps for flowing the fluid through the apparatus, pipes or conduits to move the fluid, at least one surface or substrate coated with or otherwise containing the $CeO_2$—$TiO_2$ composite, access points for sunlight or artificial light such as windows or other apertures above or around apparatus surfaces or components containing the composite, and in some embodiments lamps or other sources of artificial light. A thin outer layer of a homogenous $Ce_2$—$TiO_2$ composite exposed to a source of visible light or UV may be placed over a thicker layer of $Ce_2$—$TiO_2$ composite $TiO_2$ or other support layer. Various types of photocatalytic reactors are known or commercially available which may be adapted to accommodate a homogenous $Ce_2$—$TiO_2$ composite as disclosed herein; see Abhang, et al., International Journal of Chemical Engineering and Applications, Vol. 2, No. 5, October 2011 and Bouchy, et al., Int'l J. PhotoEner. Volume 5, Issue 3, Pages 191-197 (2003), both incorporated by reference.

The examples below are intended to further illustrate protocols for preparing, characterizing the composite thin film electrode, and uses thereof, and are not intended to limit the scope of the claims.

EXAMPLES

Film Fabrication Procedure.

The deposition of the metal oxide films was performed on a custom home-built aerosol assisted chemical vapor deposition (AACVD) setup as previously described [35-38].

All chemicals such as Titanium (IV) isopropoxide (Ti($^i$Pro)$_4$), cerium (III) acetate hydrate (Ce(OAc)$_3$.x H$_2$O), triflouro acetic acid (CF$_3$COOH) and methanol were obtained from Sigma Aldrich and were used as supplied.

A typical solution of the precursor was made by adding Ce(OAc)$_3$.x H$_2$O (0.5 g, 1.58 mmol) and Ti($^i$Pro)$_4$ (0.47 mL, 1.58 mmol) in a 100 mL Schlenk tube containing 50 mL methanol. The mixture was stirred for 1 hour followed by the addition of triflouroacetic acid to yield a clear yellow colored solution. This solution was then evaporated under vacuum to obtain a fine yellow colored powder which was re-dissolved in methanol. This final solution was used in AACVD for thin film fabrication.

The FTO substrates were cleaned in ultrasonic bath using doubly distilled water, acetone, propan-2-ol in a sequence, and then were stored in ethanol until the deposition experiments when these were air dried before being transferred to the AACVD combustion chamber (CARBOLITE, Model No. 10/25/130) (6"L×1"D). There the substrates were heated to the desired deposition temperatures of 550 and 600° C. for 10 min to attain the thermal equilibrium. In a typical deposition experiment, 15 mL of homogenous solution of Ce and Ti precursors was stirred in a 50 mL round bottom flask which was immersed in a water bath lying above the piezoelectric modulator of an ultrasonic humidifier (Model No. Cool Mist-plus serial No. ADV-CMP-85956). This piezoelectric humidifier generated an aerosol mist of the solution of precursors. Compressed air at a rate of 120 cm$^3$/min was used to transfer the aerosol mist into the reaction chamber and over the heated substrate serving as a carrier gas. The exhaust of the reaction was vented into a fume hood. When the precursor solution has completely run over the substrates in the form of mist, the coated substrates were cooled while still under a continuous flow of air, and then removed from the chamber once the temperature of is below 100° C.

Characterization of the Films.

X-ray diffraction (XRD) patterns of the composite films were obtained using a PANanalytical, X'Pert HighScore diffractometer using high intensity primary chromatic radiation i.e., CuK$_\alpha$ ($\lambda$=1.5418 Å). Scanning electron microscope (SEM) images were recorded using a Hitachi SU 8000 field emission gun (FEG)-SEM at a working distance of 10 mm using an accelerating voltage of 5 kV. Ce/Ti metallic ratio was determined by Energy dispersive X-ray spectrometer (INCA Energy 200, Oxford Instruments). X-ray photoelectron spectroscopy (XPS) was performed under vacuum (1×10$^{-6}$ Pa) using an ULVAC-PHI Quantera II, 32-channel Spherical Capacitor Energy Analyzer by a monochromatic Al K$\alpha$ radiation (1486.8 eV) at natural energy width of 680 meV. The binding energies were calibrated using carbonaceous C is line (284.6 eV) as a reference. UV-Vis absorption measurements were done using a Perkin Elmer Lambda 950 NIR Spectrophotometer in which the wavelength range used was 300-900 nm. The film thickness measurements were also performed by a KLA Tencore P-6 surface profiler.

Photo-Electrochemical (PEC) Experiments.

Photoelectrochemical experiments were carried out using a conventional three-electrode design, held in a single-compartment quartz cell. In there, a saturated-potassium-chloride silver chloride electrode (Ag/AgCl) was used as a reference electrode, a platinum wire was used as a counter electrode, while the composited metal oxide electrode was used as the working electrode. The electrolyte used was an aqueous solution (0.1 M) of Na$_2$SO$_4$. Linear sweep voltammetry and chronoamperometric measurements of the photocurrent were done by a Princeton Applied Research electrochemical workstation (PAR-VersaSTAT-3) where the potential range was 0.0 to +1.0 V vs. Ag/AgCl at a sweeping rate of 10 mVs$^{-1}$. Bode phase at open-circuit voltage is recorded in order to estimate the lifetime of photo-generated charge carriers. A 150 W Xenon arc lamp was used as the light source which was coupled to an Air Mass (AM) 1.5 global filter (100 mWcm$^{-2}$).

Preparation of $CeO_2$—$TiO_2$ Composite Thin Films.

AACVD is an economical and reliable method of making bi and trimetallic oxide thin films with characteristic features of controlled thickness, good uniformity of phases and strong adhesion with the substrate surface while the films produced through this method are particularly interesting for PEC and electrochemical sensing applications; [35] M. A. Ehsan, A. S. Hakeem, H. Khaledi, M. Mazhar, M. M. Shahid, A. Pandikumar, N. M. Huang, RSC Advances, 5, 103852-103862 (2015); M. A. Ehsan, H. Khaledi, Z. Arifin, M. Mazhar, Polyhedron, 98, 190-195 (2015); M. A. Ehsan, H. Khaledi, A. Pandikumar, N. M. Huang, Z. Arifin, M. Mazhar, Journal of Solid State Chemistry, 230, 155-162 (2015); M. A. Ehsan, H. Khaledi, A. Pandikumar, P. Rameshkumar, N. M. Huang, Z. Arifin, M. Mazhar, New Journal of Chemistry, 39 7442-7452 (2015); M. Mansoor, K. Munawar, S. Lim, N.-M. Huang, M. Mazhar, M. Akhtar, M. Siddique, New Journal of Chemistry, 41, 7322-7330 (2017); K. Munawar, M. A. Mansoor, W. J. Basirun, M. Misran, N. M. Huang, M. Mazhar, RSC Advances, 7, 15885-15893 (2017).

AACVD utilizes transparent precursor solutions in any appropriate solvent for the processing of thin films; therefore the solubility of precursor is a prime concern for the adoption of this method. $Ti(^iPro)_4$ and $Ce(OAc)_3 \cdot xH_2O$ were used as the Ti precursor and the Ce precursor, respectively, while trifluoroacetic acid was used to increase the solubility of these precursors in methanol. Methanol is specifically chosen in this experiment for its capabilities as a reducing agent, hence, promoting the chances of creating the surface defects in the form of oxygen vacancies in the resulting composite films. These surface defects are thought to work as electron traps preventing the hole-electron recombination. Moreover, oxygen vacancies can act as strong binding and dissociation sites for adsorbates, thereby augmenting their catalytic conversion. The methanol solution of the precursors was then transported to the substrates using Air carrier gas, and this whole set of conditions created a synergy to devise a facile and single step deposition of the required films onto FTO substrates at 550 and 600° C. and took ca. 60 minutes. The resultant films were of pale yellow color, highly stable, reproducible with exceptional precision, and eminently adherent to the FTO substrate.

XRD Analysis of $CeO_2$—$TiO_2$ Composites.

FIG. 1 shows the X-ray diffraction patterns (XRDs) of $CeO_2$—$TiO_2$ composite thin films developed at 550 and 600° C., respectively. The XRD patterns of composite films exhibited characteristic diffraction peaks of both $CeO_2$ and $TiO_2$ crystalline phases. The diffraction peaks emerged at $2\theta$ values of 28.7°, 33.2°, 47.7°, 56.6°, 79.5°, 88.9° corresponding to the reflection planes (111), (002), (002), (022), (024), (113), (024), and (224) respectively, thereby indicating the formation of pure cerianite ($CeO_2$) in cubic crystal structure, with space group $Fm\bar{3}m$ as analyzed with ICSD database card no. 98-002-8709. Diffraction peaks of $TiO_2$ at $2\theta$ of 25.3, 37.9 53.8°, 55.0°, 62.7°, 68.8° and 75.0° can be indexed as the (011), (004), (015), (121), (024), (116) and (125) planes of anatase $TiO_2$ with ICSD file no. 98-000-9852. Peaks indicated by (*) are diffracted from crystalline $F:SnO_2$ (ICSD=98-003-9173) of the FTO substrate. Both of the XRD patterns are dominated by crystalline peak at $2\theta=26.60$ from $SnO_2$. XRD patterns reveal that both $CeO_2$ and $TiO_2$ phases are equally crystallized and do not show any sort of crystalline peaks from any phases of cerium oxide and $TiO_2$. The XRD studies demonstrate the formation of $CeO_2$—$TiO_2$ composite at temperatures of 550 and 600° C. via AACVD route.

Morphology and Compositional Characterization.

The morphological and compositional details of the composite oxide films have been obtained through FESEM and EDX. The morphologies of both $CeO_2$—$TiO_2$ composite oxide films deposited at different temperatures of 550 and 600° C. show the spherical-shaped particles with a diameter in the range of 0.8-2 m, as analyzed from low resolution images (FIGS. 2A and 2C). Apparently, both films displays similar surface topography, however, the enlarged views of the image (FIGS. 2B and 2D) highlight the difference in the surface textures of these microspheres. The mesoporous microspheres with pore size in range (10-28 nm) are developed at 550° C. while with the rise in deposition temperature to 600° C., the porous and rough texture of microspheres diminishes and spherical objects with smooth and plain texture are emerged. The porous spherical morphology obtained at 550° C. can prove very effective for PEC functions as the liquid electrolytes can penetrate into the pores and in the interior of the film. Therefore the charge transfer reactions can occur to a greater extent because of the large area of solid/electrolyte interfaces. Mesoporous materials have been even demonstrated to have narrower bandgaps, thus enhancing their visible light activity.

Figure 3I:
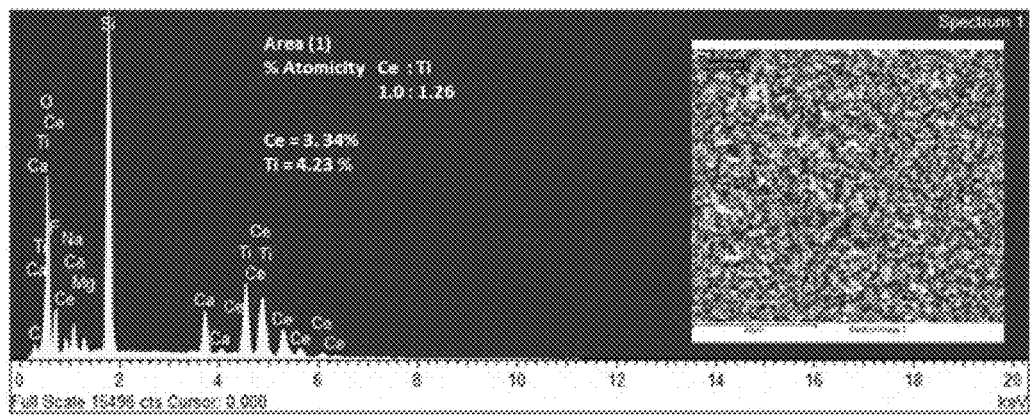
FIGS. 3I-3K show EDX spectra recorded from different areas of $CeO_2$—$TiO_2$ composite film deposited on FTO glass substrate at 550° C.
Figure 3J:
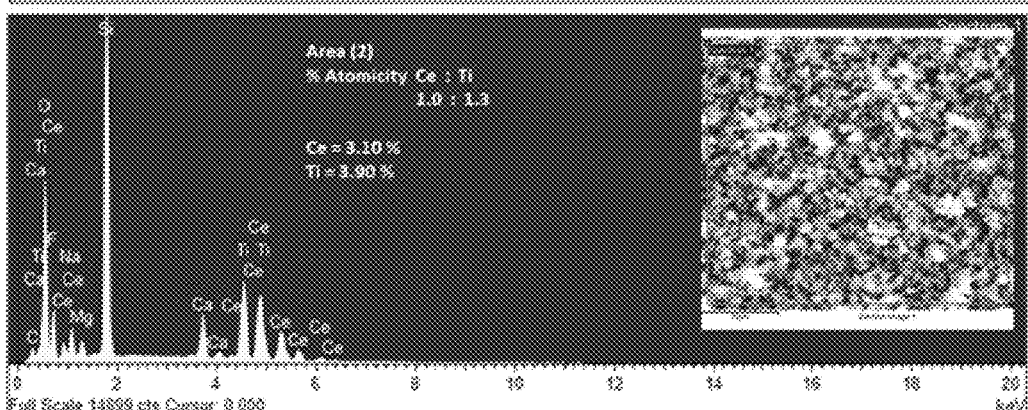
Figure 3K:
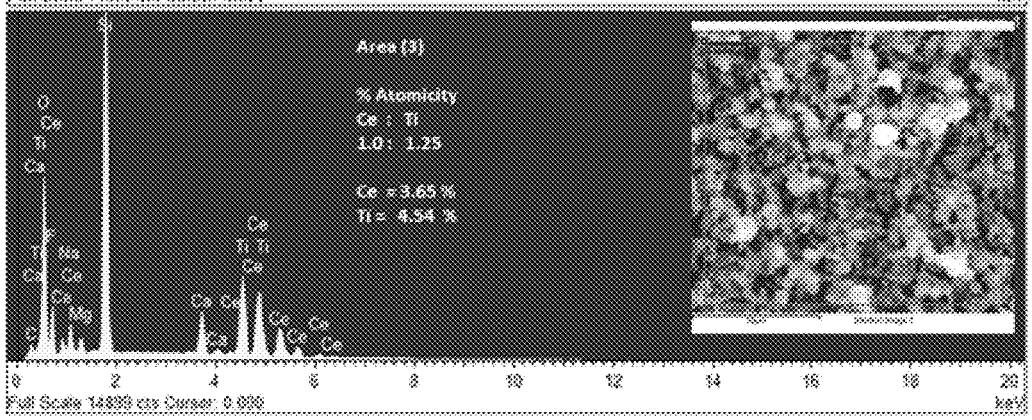

EDX analysis indicated a uniform atomic concentration of Ce and Ti in all regions examined, indicating that $CeO_2$ and $TiO_2$ phases are uniformly distributed all over the composite film. EDX was used to map the Ce and Ti distribution in the composite film which provided a visualization of a uniform distribution of the Ce and Ti atoms throughout the surface of the film. (FIGS. 3A-3H). The elemental composition of the films and the purity of the composite were analyzed by energy dispersive X-ray analyses. Several different small and large areas of the $CeO_2$—$TiO_2$ composite films were examined by EDX and the atomic ratio of Ce to Ti was found to be around 1.0:1.0 (FIGS. 3I, 3J and 3K) which is in agreement with the initial concentration of reactant precursors $Ce(OAc)_3 \cdot xH_2O$, and $Ti(^iPro)_4$ in the methanol solution. In some embodiments a uniform atomic concentration of Ce and Ti may vary from each other by no more than 0.01, 0.02, 0.05, 0.1, 0.2, 0.5, 1, 2, or 5 atomic % or any intermediate value within this range.

Xps Analysis.

Figure 4A:
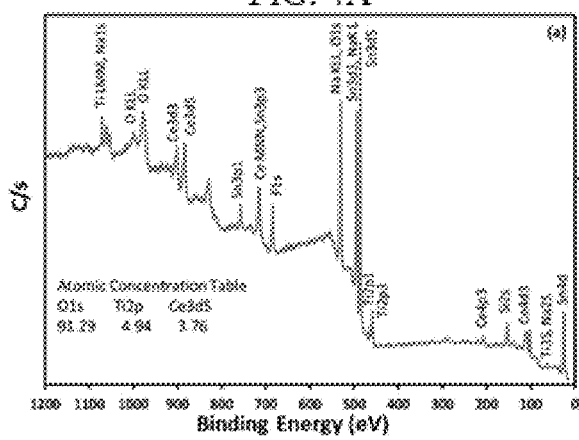
FIGS. 4A-4D: Survey scan XPS spectrum of $CeO_2$—$TiO_2$ composite film made at 550° C.
Figure 4B:
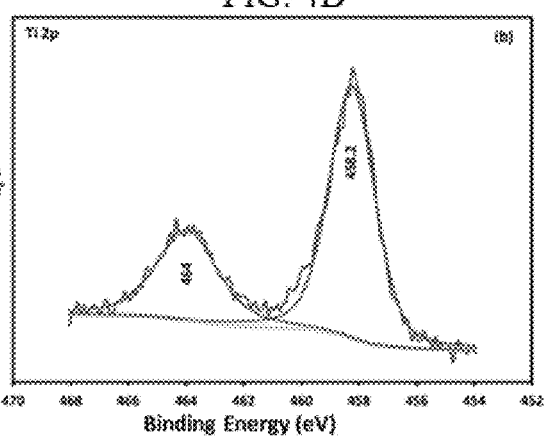
Figure 4C:
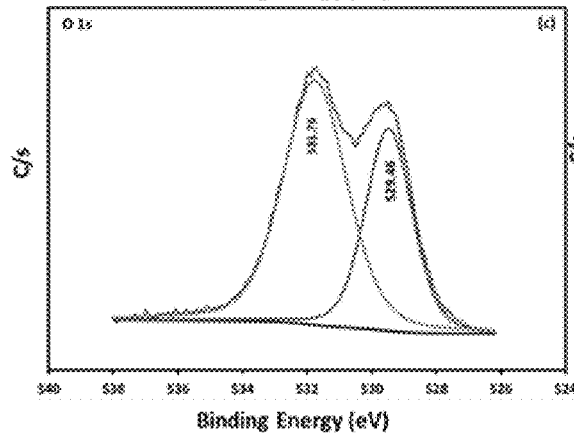
Figure 4D:
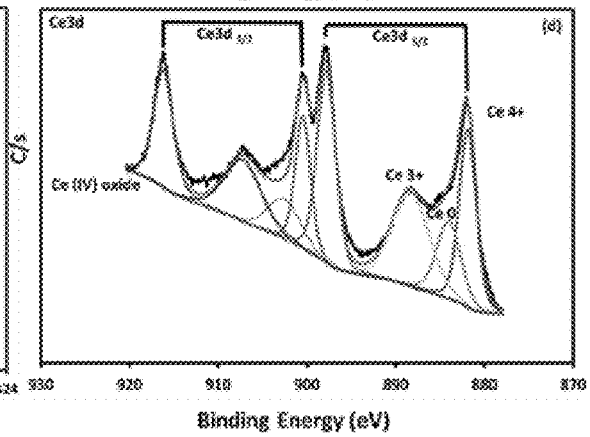

Further, the quantitative composition and oxidation states of constituent elements in $CeO_2$—$TiO_2$ composite film was studied by XPS survey scan and high resolution scan analyses respectively, as shown in FIGS. 4A-4D. In the survey spectrum, FIG. 4A, peaks of C, O, Ti and Ce can be clearly observed and the atomic ratio of Ce to Ti was calculated to be 0.70:1.0. Therefore it can be concluded that the XPS results are validating the EDX data. High-resolution scans of the $CeO_2$—$TiO_2$ composite show detailed chemical environment of elements. The binding energies of Ti2p3/2 and Ti2p1/2 in FIG. 4C are found at 458.2 and 464.0 eV, respectively, which was assigned to typical $Ti^{4+}$ in $TiO_2$ [43, 44]. In Ce3d spectrum (FIG. 4D), obvious shakeup satellite peaks are observed. The characteristic peaks of Ce3d3/2 and Ce3d5/2 were fitted according to protocols described and incorporated by reference to L. Luo, Sichuan: China Academy of Engineering Physics, (2005); and Y. Tan, S. Zhang, R. Shi, W. Wang, K. Liang, International Journal of Hydrogen Energy, 41 5437-5444 (2016).

Existence of $CeO_2$ was confirmed by the binding energies of Ce3d5/2 and Ce3d3/2 located at 881.9, 897.7, 900.5 and 916.0 eV. FIG. 4C presents the photoelectron peaks of O 1s. The peak of O 1s was wide and asymmetric indicating that there is more than one chemical state from the binding energy perspective. It includes crystal lattice oxygen $O_{Ce-O}$ (529.4 eV) and $O_{Ti-O}$ (531.7 eV).

Optical Properties.

The light absorption properties of $CeO_2$—$TiO_2$ composite film were investigated by UV-Vis spectrophotometry. FIG. 5 indicates the optical absorption spectrum in wavelength range of 300-900 nm of $CeO_2$—$TiO_2$ film deposited at 550° C. Being pale yellow color, composite film shows an absorption edge at c.a. 580 nm, corresponding to a direct band gap ($E_g$) of 2.6 eV in Tauc plot (inset FIG. 5).

The reported band gaps for pristine $CeO_2$ and $TiO_2$ are 2.8 and 3.1 eV, respectively [48, 49]. However, for $CeO_2$—$TiO_2$ composite film, the bandgap value is found to be 2.6 eV. This decrease in the band gap energy of $CeO_2$—$TiO_2$ composite thin film as compared to the band gap energies of individual $CeO_2$ or $TiO_2$ can be attributed to the coupling of $CeO_2$ and $TiO_2$ components in composite material. Due to the development of heterojunction, it is quite plausible that electrons move from the conduction band of higher band gap component (i.e., $TiO_2$) to the conduction band of lower band gap component' (i.e., $CeO_2$), thereby diminishing the electron recombinations and thus increasing the lifetime of $e^-$ and $h^+$ at the same time.

Photoelectrochemical (PEC) Properties.

Photoelectrochemical experiments were carried out using a conventional three-electrode design, held in a single-compartment quartz cell. In there, a saturated-potassium-chloride silver chloride electrode (Ag/AgCl) was used as a reference electrode, a platinum wire was used as a counter electrode, while the composited metal oxide electrode was used as the working electrode. The photocurrent was recoded under simulated sunlight illumination at 100 mW $cm^{-2}$ from a 150 W xenon lamp coupled with an AM 1.5G filter. FIG. 6A shows the I-V characteristics of the $CeO_2$—$TiO_2$ film electrodes recorded in the dark and light conditions, respectively. Both $CeO_2$—$TiO_2$ composite electrodes exhibit an anodic current, which steadily increases with increasing anodic potential as expected from 0.0 to +1.0 V under the light illumination. The $CeO_2$—$TiO_2$ film electrode deposited at 550° C. display higher photo-current density (~1000 µA $cm^{-2}$) than the electrode made at 600° C. (~800 µA $cm^{-2}$). This difference in the photo-responses of two electrodes is attributed to the electrode structural variations seen in SEM analysis (FIGS. 2A-2D). High resolution of SEM analysis made us anticipate that $CeO_2$—$TiO_2$ electrode made at 550° C. with relatively higher mesoporous micro-spherical texture (FIG. 2B) should produce superior density of photocurrent compared to that of its relatively less porous textured counterparts made at 600° C. The mesoporous micro spherical objects would allow amplified absorption of photons and at an increased electrode-electrolyte interfacial area, leading to a reduction in recombination of electron hole pairs as the light generated holes travels through material pathways before being collected at the interface. This process therefore, increases the photo-response.

$CeO_2$—$TiO_2$ materials made previously were limited to explore the photo decomposition of organic pollutants only and no similar report on the PEC properties of $CeO_2$—$TiO_2$ composite films exist to date for the comparison to the inventors' results. However, the photocurrent measured with $CeO_2$—$TiO_2$ is promising in comparison to the recently reported metal oxide photoanodes made by AACVD (Table 1).

TABLE 1

Photoresponses measured for metal oxides anodes prepared by AACVD recently.

| oxide photo catalyst | Max. Photocurrent density (µAcm$^{-2}$) | Potential range (V) | References |
|---|---|---|---|
| $Mn_2O_3$—$TiO_2$ | 1300.0 | 0.0 to 0.7 | M.A. Mansoor, M. Mazhar, A. Pandikumar, H. Khaledi, H.N. Ming, Z. Arifin, International Journal of Hydrogen Energy, 41, 9267-9275 (2016). |
| $Mn_2O_3$—$4TiO_2$ | 343.0 | −0.3 to 0.7 | M.A. Mansoor, M. Mazhar, V. McKee, Z. Arifin, Polyhedron, 75, 135-140 (2014). |
| $Mg_2TiO_5$ | 450 | −0.6 to 1.0 | M.A. Ehsan, R. Naeem, V. McKee, A.S. Hakeem, M. Mazhar, Solar Energy Materials and Solar Cells, 161, 328-337 (2017). |
| $MnZnO_3$ | 300 | −0.8-to 1.0 | M. Mansoor, N. Huang, V. McKee, T.N. Peiris, K. Wijayantha, Z. Arifin, M. Misran, M. Mazhar, Solar Energy Materials and Solar Cells, 137, 258-264 (2015). |
| $CeO_2$-MnO | 265.0 | 0.0 to 0.7 | M.A. Mansoor, M. Mazhar, M. Ebadi, H.N. Ming, M.A.M. Teridi, L.K. Mun, New Journal of Chemistry, 40, 5177-5184 (2016). |
| $CeO_2$—$TiO_2$ (550° C.) | 1000.0 | 0.0 to 0.7 | Invention |

As shown above in some embodiments the composite of the invention may exhibit a maximum photocurrent density (µAcm$^{-2}$) of at least 500, 600, 700, 800, 900 or 1,000 and have a potential range (V) ranging from 0.0, 0.1, 0.2, 0.3, 0.4, 0.5, 0.6 to 0.7. Photocurrent is the electric current through a photosensitive device, such as a photodiode, as the result of exposure to radiant power. The photocurrent may occur as a result of the photoelectric, photoemissive, or photovoltaic effect.

Generally, a photocatalyst for PEC water splitting is considered efficient if it produces higher current density at lower potentials upon the light irradiation. In the current invention $CeO_2$—$TiO_2$ photoelectrodes start generating current around ~0.1 V. The photocurrent density increases with an increase in forward bias potential and reaches to maximum values (e.g., 1500 & 1200 µA/$cm^2$) at 1.0 V. However, this potential value may be considered higher than the required benchmarks and the photocurrent density value (1000 µA/$cm^2$) at 0.7 V can be reported as a final value.

The chemical and structural stability of $CeO_2$—$TiO_2$ photoanodes was examined using the chronoamperometry measurements at 0.7 V vs. Ag/AgCl under continuous light and dark conditions as made by on-off illumination. FIG. 6B shows that both photoanodes exhibit steady and reproducible photocurrent with no significant decay in the photocurrent during multiple on-off illumination cycles in the course of 60 mins. This indicates the higher efficiency and excellent photo stability of the composite electrodes. In addition, this result is consistent with the photocurrents obtained using the LSV too (FIG. 6A). The higher photostability of composite electrodes is attributed with the electrode fabrication method. During deposition by AACVD, $CeO_2$ and $TiO_2$ crystallites were grown and sintered simultaneously and directly on substrate surface to form highly interconnected porous and spherical architecture (FIGS. 2A-2D). This particle-to-particle connection is of substantial value to fabricate efficient electrocatalytic devices. The inventors consider that particle interconnection enhances the electrical contact and therefore the conductivity of the nanoparticle based thin films which improves the charge transport properties and the resulting performance of the composite electrodes.

Figure 7A:
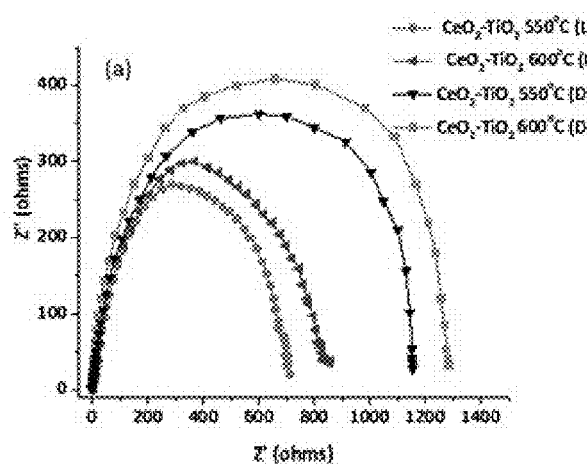
FIGS. 7A and 7B. EIS Nyquist plots (FIG. 7A) and Bode Phase angle plots of $CeO_2$—$TiO_2$ composite electrodes prepared at 550 and 600° C. and recorded in 0.1 M $Na_2SO_4$ aqueous solution in dark and light conditions (FIG. 7B).

Further the electrochemical impedance spectroscopy (EIS) is applied to study the charge separation and transfer behavior at photoelectrode-electrolyte interface. FIG. 7A displays the Nyquist plots of EIS corresponding to $CeO_2$—$TiO_2$ composite electrodes in the frequency range of 0.1 Hz to 10 kHz in the dark and under light conditions. FIG. 7A shows that both of the composite electrodes exhibit large impedance-circle in the dark and observes the largest transfer resistance ($R_{ct}$) values. However, the impedance-circle radius decreases rapidly under illumination without bias potential, indicating that the charge transfer reaction occurs on the surface of the semiconductors due to electrons excited from valance band to conduction band. The $R_{ct}$ values of the electrodes measured in the dark and under light illumination are listed in the Table 2.

TABLE 2

Charge transfer resistance ($R_{ct}$), maximum frequency ($f_{max}$) and lifetime of charge carrier ($\tau_n$) calculated for $CeO_2$—$TiO_2$ film electrodes fabricated at 550 and 600° C. via AACVD

| Thin films | $R_{ct}$ (ohm, Ω) | $f_{max}$ (Hz) | $\tau_n$ (msec) |
| --- | --- | --- | --- |
| $CeO_2$—$TiO_2$ 600 (L) | 848.1 | 0.31 | 513 |
| $CeO_2$—$TiO_2$ 550 (L) | 708.6 | 0.23 | 692 |
| $CeO_2$—$TiO_2$ 600 (D) | 1291.3 | 3.40 | 46.8 |
| $CeO_2$—$TiO_2$ 550 (D) | 1154.6 | 4.75 | 33.5 |

As shown above, in some embodiments, the thin films described herein may have charge transfer resistance in the dark within the range of about 600, 650, 700, 708.6, 750, 800, 848.1, 850, or –900 ohm (Ω) (dark) and in the light of about 1,000, 1,050, 1,100, 1,154.6, 1291.3, 1,300, 1,350 to 1,400 ohm; a maximum frequency in the dark within the range of about 3, 3.4, 3.5, 4, 4.5, 4.75, or 5 and in the light of about 0.2, 0.23, 0.25, 0.275, 0.3 or 0.32 Hz; and a lifetime of charge carrier in the dark of about 30, 33.5, 35, 40, 45, 46.8, or 50 and in the light of about 500, 513, 550, 600, 650, 692 or 700. In one embodiment, when the composite thin film electrode of the electrochemical cell is illuminated as described for Table 2, the composite thin film electrode has a charge transfer resistance ($R_{ct}$) in a range of 600-1,000Ω, preferably 650-900 n, more preferably 700-850Ω.

Upon illumination, a $CeO_2$—$TiO_2$ electrode made as disclosed herein at 550° C. exhibited narrow EIS Nyquist plot than its counterpart developed at 600° C. which suggested the better separation and fast transportation of electron and holes due to its mesoporous spherical architecture that promoted higher photocurrent in it. The charge transport properties in the $CeO_2$—$TiO_2$ electrode developed at 600° C. declined due to its diminished microstructure porosity, thus reducing photocurrent.

Figure 7B:
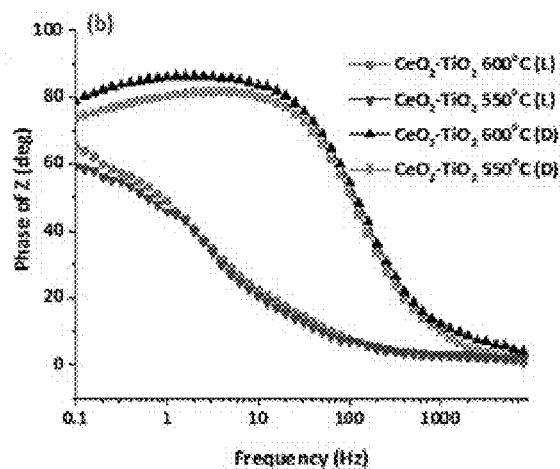

To further determine the charge-transfer resistance phenomenon, the life time ($\tau_{rec}$) of the majority carriers in the $CeO_2$—$TiO_2$ electrodes was measured by recording their frequency dependence phase angle plot (Bode plots) in the dark and under light conditions, respectively, and results are shown in FIG. 7B. The life time reflects the recombination probability of the photo generated electrons and holes in the photoelectrode [58]. The life time ($\tau_{rec}$) of photogenerated charges were estimated from the equation $\tau_n = 1/(2\pi f_{max})$, where $f_{max}$ is the frequency peak maximum in the Bode plot; D. Wang, D. Astruc, Chemical Society Reviews, 46 816-854 (2017). In dark conditions, Bode curves show a maximum peak at higher frequency which tends to shift to lower frequencies upon the incidence of light (FIG. 7B). The lifetime ($\tau_{rec}$) for the $CeO_2$—$TiO_2$ electrodes in dark and light conditions was calculated according to the previous equation and Table 2 summarizes all data from Bode plot experiment. Table 2 indicates that upon illumination the life time of the majority of photo-generated charges in the $Ce_2$—$TiO_2$ electrode made at 550° C. is clearly longer than that of the $Ce_2$—$TiO_2$ electrode made at 600° C. In other words, the $CeO_2$—$TiO_2$ composite have the capability to improve the separation of photo generated electrons and holes by increasing their life time. This facilitates the transfer of the majority of the photo-generated charge carriers to the counter electrode and likewise, the transport of photo generated electrons to the electrolyte is enhanced.

While not being bound to any theory or mechanism, based on the above PEC results, the inventors believe that a mechanism for charge separation and transfer in $CeO_2$—$TiO_2$ composite during photocatalysis process may that depicted by FIG. 8. Both $TiO_2$ and $CeO_2$ are activated under solar light, which results in the formation of photo generated holes in the valence band (VB) and electrons in the conduction band (CB). The activated electrons at conduction band of $CeO_2$ are transferred to the low energy conduction band of $TiO_2$ through the interface [47], followed by their transportation to the external circuit via FTO reducing $e^-$-$h^+$ recombination, as shown in FIG. 8. Similarly, VB holes produced in $TiO_2$ could be injected to the VB of $CeO_2$ by the control of the interface. The hole trapping process is more facilitated in the mixed semiconductor system like the one presented here, which increases its photo generation efficiency. The resulting trapped holes at the surface of the photoanode interact with water for its photo-oxidation to $O_2$ and $H^+$ ions. The $H^+$ ions are transported through the electrolyte towards the counter electrode, where they react with photo-generated electrons to produce hydrogen.

As shown herein, a crystalline and porous heterojunction of $CeO_2$—$TiO_2$ was designed as a thin film on a FTO substrate for utilization in photoelectrochemical (PEC) water splitting. In doing so, the critical limitation regarding the precursors was surpassed, that is, their compatibility to each other in AACVD while still allowing the homogenous growth of all the components in mixed oxides. This was achieved by specifically choosing and modifying the precursors into their trifluroacetates soluble in methanol. It was discovered from evaluation of the resulting films, that those fabricated at a lower temperature obtained a mesoporous structure and had enhanced interface contacts of the two oxides, thus providing a higher photocatalytic performance. While not being bound to any theory, the inventors believe that PEC activity results from a combination of interface contact and microporosity and that coupling of two n-type semiconductors—$CeO_2$ and $Ti_2$—not only reduces the bandgap but also rectifies the electron transfer from $CeO_2$ to TiO$_2$, leading to in situ separation of electron and hole pairs, thereby inducing higher and stable photocatalytic activity.

Electrochemical impedance spectroscopy and Bode plot also revealed that charge transfer from CeO$_2$ to TiO$_2$ was feasible under the specific limits of experimental conditions pertaining to the described film parameters.

The detailed characterization and analysis performed by the inventor show that the CeO$_2$—TiO$_2$ composite thin films produced by the methods disclosed herein can support many applications involving photocatalytic reactions such as photodegradation of organic pollutants, electrochemical modifications of explosives, as well as the sensing by redox reactions.

Terminology

Terminology used herein is for the purpose of describing particular embodiments only and is not intended to be limiting of the invention.

The headings (such as "Background" and "Summary") and sub-headings used herein are intended only for general organization of topics within the present invention, and are not intended to limit the disclosure of the present invention or any aspect thereof. In particular, subject matter disclosed in the "Background" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

As used herein, the singular forms "a", "an" and "the" are intended to include the plural forms as well, unless the context clearly indicates otherwise.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items and may be abbreviated as "/".

Links are disabled by deletion of http: or by insertion of a space or underlined space before www. In some instances, the text available via the link on the "last accessed" date may be incorporated by reference.

The present disclosure is intended to include all hydration states of a given compound or formula, unless otherwise noted or when heating a material. For example, Ce(OAc)$_3$.xH$_2$O includes both anhydrous and hydrated forms.

As used herein in the specification and claims, including as used in the examples and unless otherwise expressly specified, all numbers may be read as if prefaced by the word "substantially", "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), +/−15% of the stated value (or range of values), +/−20% of the stated value (or range of values), etc. Any numerical range recited herein is intended to include all sub-ranges subsumed therein.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10 it also describes subranges for Parameter X including 1-9, 1-8, 1-7, 2-9, 2-8, 2-7, 3-9, 3-8, 3-7, 2-8, 3-7, 4-6, or 7-10, 8-10 or 9-10 as mere examples. A range encompasses its endpoints as well as values inside of an endpoint, for example, the range 0-5 includes 0, >0, 1, 2, 3, 4, <5 and 5.

As used herein, the words "preferred" and "preferably" refer to embodiments of the technology that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the technology. As referred to herein, all compositional percentages are by weight of the total composition, unless otherwise specified. As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present invention that do not contain those elements or features.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

Spatially relative terms, such as "under", "below", "lower", "over", "upper", "in front of" or "behind" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

All publications and patent applications mentioned in this specification are herein incorporated by reference in their entirety to the same extent as if each individual publication or patent application was specifically and individually indicated to be incorporated by reference, especially referenced is disclosure appearing in the same sentence, paragraph, page or section of the specification in which the incorporation by reference appears.

The citation of references herein does not constitute an admission that those references are prior art or have any relevance to the patentability of the technology disclosed herein. Any discussion of the content of references cited is intended merely to provide a general summary of assertions made by the authors of the references, and does not constitute an admission as to the accuracy of the content of such references.

The invention claimed is:

1. A method for making a homogenous $CeO_2$—$TiO_2$ composite film, comprising:
    dispersing a solution of metal trifluoroacetates of cerium and titanium in a carrier gas to form an aerosol mist;
    conducting aerosol-assisted chemical vapor deposition ("AACVD") at a temperature in a range of from 500 to 650° C., with the aerosol mist;
    contacting the aerosol mist, in the AACVD, with a fluorine-doped tin oxide substrate, thereby depositing the homogenous $CeO_2$—$TiO_2$, composite film onto the fluorine-doped tin oxide substrate,
    wherein the $CeO_2$—$TiO_2$ composite film comprises mesoporous or smooth microspheres comprising $CeO_2$, $TiO_2$, or a combination thereof, and wherein the mesoporous or smooth microspheres have an average diameter in a range of from 0.8 to 2.0 µm.

2. The method of claim 1, further comprising:
    reacting trifluoroacetic acid with triacetatocerium (III) and tetra isopropoxytitanium (IV) to form an initial solution of the metal trifluoroacetates;
    evaporating the initial solution to obtain a residue; and
    redissolving the residue in methanol to obtain the solution of metal trifluoroacetates of cerium and titanium as a methanol solution comprising the metal trifluoroacetates in a Ce:Ti molar ratio in a range of from 1.2:1 to 1:1.2.

3. The method of claim 2, wherein the reacting is conducted in methanol.

4. The method of claim 2, wherein the methanol solution has a Ce:Ti molar ratio of about 1:1.

5. The method of claim 1, wherein the aerosol in the AACVD comprises a homogenous mixture of the metal trifluoroacetates in air, the method comprising a single depositing.

6. The method of claim 5, comprising no further dispersion, coating, or heating.

7. The method of claim 1, wherein the temperature of the AACVD and contacting are in a range of from 540 to 560° C., and
    wherein the film comprises the mesoporous microspheres having a pore size in a range of from 10 to 28 nm.

8. The method of claim 1, wherein the temperature of the AACVD and contacting are in a range of from 590 to 610° C., and
    wherein the film comprises smooth microspheres with a substantially non-porous texture.

9. The method of claim 1, wherein the solution comprises toluene as solvent.

10. The method of claim 1, wherein the solution comprises acetic acid as solvent.

11. The method of claim 1, wherein the solution comprises tetrahydrofuran as solvent.

12. The method of claim 1, wherein the solution comprises acetonitrile as solvent.

13. The method of claim 1, wherein the microspheres have an average diameter in a range of from 0.8 to 1.5 µm.

14. The method of claim 1, wherein the microspheres have an average diameter in a range of from 0.8 to 1.0 µm.

15. The method of claim 1, wherein the microspheres have an average Wadell sphericity value in a range of from 0.3 to 0.9.

16. The method of claim 1, wherein the microspheres have an average Wadell sphericity value in a range of from 0.3 to 0.8.

17. The method of claim 1, wherein the microspheres comprise the Ce and the Ti in an atomic ratio of 0.7:1.0.

18. The method of claim 1, wherein the temperature of the conducting of the AACVD and the contacting is in a range of from 575 to 610° C.

* * * * *